(12) United States Patent
Takano

(10) Patent No.: US 9,627,259 B2
(45) Date of Patent: Apr. 18, 2017

(54) DEVICE MANUFACTURING METHOD AND DEVICE

(71) Applicant: Kabushiki Kaisha Toshiba, Minato-ku, Tokyo (JP)

(72) Inventor: Masamune Takano, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/928,482

(22) Filed: Oct. 30, 2015

(65) Prior Publication Data

US 2016/0141209 A1     May 19, 2016

(30) Foreign Application Priority Data

Nov. 14, 2014  (JP) ................ 2014-231873
Nov. 14, 2014  (JP) ................ 2014-231874
Nov. 14, 2014  (JP) ................ 2014-231875
Jan. 28, 2015  (JP) ................ 2015-014569

(51) Int. Cl.

| | | |
|---|---|---|
| *H01L 21/78* | (2006.01) | |
| *H01L 21/3065* | (2006.01) | |
| *H01L 21/304* | (2006.01) | |
| *H01L 21/02* | (2006.01) | |

(Continued)

(52) U.S. Cl.
CPC ........ *H01L 21/78* (2013.01); *H01L 21/02076* (2013.01); *H01L 21/3043* (2013.01); *H01L 21/3065* (2013.01); *H01L 21/6835* (2013.01); *H01L 21/6836* (2013.01); *H01L 24/26* (2013.01); *H01L 2221/6834* (2013.01); *H01L 2221/68327* (2013.01)

(58) Field of Classification Search
CPC  B24C 1/003; B24C 1/00; B24C 1/045; H01L 21/78; H01L 21/3043; H01L 21/6836; H01L 2221/68327; H01L 2221/6834

See application file for complete search history.

(56) References Cited

U.S. PATENT DOCUMENTS

| | | |
|---|---|---|
| 5,888,883 A | 3/1999 | Sasaki et al. |
| 6,500,758 B1 | 12/2002 | Bowers |
| 6,653,210 B2 | 11/2003 | Choo et al. |

(Continued)

FOREIGN PATENT DOCUMENTS

| | | |
|---|---|---|
| CN | 1502118 A | 6/2004 |
| JP | 2001-044143 A | 2/2001 |

(Continued)

OTHER PUBLICATIONS

Korean Office Action issued on Jun. 2, 2016 by the Korean Intellectual Property Office in counterpart Korean patent application 10-2015-0112416, along with English translation thereof.

*Primary Examiner* — Bac Au
(74) *Attorney, Agent, or Firm* — White & Case LLP

(57) ABSTRACT

A device manufacturing method according to an embodiment includes forming a film on the second surface side of a substrate having a first surface and the second surface, forming a trench in part of the substrate from the first surface side, while leaving the film to remain, and injecting a substance onto the film from the second surface side, to remove the film at the portion on the second surface side of the trench.

17 Claims, 19 Drawing Sheets

(51) Int. Cl.
 *H01L 21/683* (2006.01)
 *H01L 23/00* (2006.01)

(56) References Cited

U.S. PATENT DOCUMENTS

| | | | |
|---|---|---|---|
| 7,790,578 | B2 | 9/2010 | Furui |
| 2003/0121511 | A1 | 7/2003 | Hashimura et al. |
| 2006/0276006 | A1 | 12/2006 | Yang et al. |
| 2007/0114488 | A1* | 5/2007 | Jackson ............. B23Q 11/1053 252/71 |
| 2008/0006302 | A1 | 1/2008 | Araki et al. |
| 2008/0213978 | A1 | 9/2008 | Henry et al. |
| 2010/0044873 | A1 | 2/2010 | Kameyama |
| 2010/0136766 | A1 | 6/2010 | Sakamoto et al. |
| 2011/0014777 | A1 | 1/2011 | Haji et al. |
| 2011/0265815 | A1 | 11/2011 | Mitake et al. |
| 2012/0247504 | A1 | 10/2012 | Nasr et al. |
| 2012/0322240 | A1 | 12/2012 | Holden et al. |
| 2013/0084658 | A1 | 4/2013 | Vaupel et al. |
| 2013/0084659 | A1* | 4/2013 | Martens ................. H01L 22/14 438/14 |
| 2013/0267076 | A1 | 10/2013 | Lei et al. |
| 2014/0020846 | A1 | 1/2014 | Hirakawa et al. |
| 2014/0026157 | A1 | 1/2014 | Wang et al. |
| 2015/0020850 | A1 | 1/2015 | Kato et al. |
| 2015/0034900 | A1 | 2/2015 | Aihara |
| 2015/0104929 | A1 | 4/2015 | Lei et al. |
| 2016/0141200 | A1 | 5/2016 | Takano |
| 2016/0218037 | A1* | 7/2016 | Takano ................... H01L 21/78 |

FOREIGN PATENT DOCUMENTS

| | | |
|---|---|---|
| JP | 3636835 B2 | 4/2005 |
| JP | 2007-142277 A | 6/2007 |
| JP | 2007-250620 A | 9/2007 |
| JP | 2007-258640 A | 10/2007 |
| JP | 2008-141135 A | 6/2008 |
| JP | 2013-222822 A | 10/2013 |
| JP | 2014-090127 A | 5/2014 |
| JP | 2014-159052 A | 9/2014 |
| JP | 2014165388 A | 9/2014 |
| KR | 10-2011-0000637 A | 1/2014 |
| KR | 10-1429728 B1 | 8/2014 |
| TW | 200529308 A | 9/2005 |
| TW | 200641985 A | 12/2006 |
| TW | 200811942 A | 3/2008 |
| TW | 201312676 A | 3/2013 |
| TW | 201448018 A | 12/2014 |
| TW | 201507020 A | 2/2015 |

\* cited by examiner

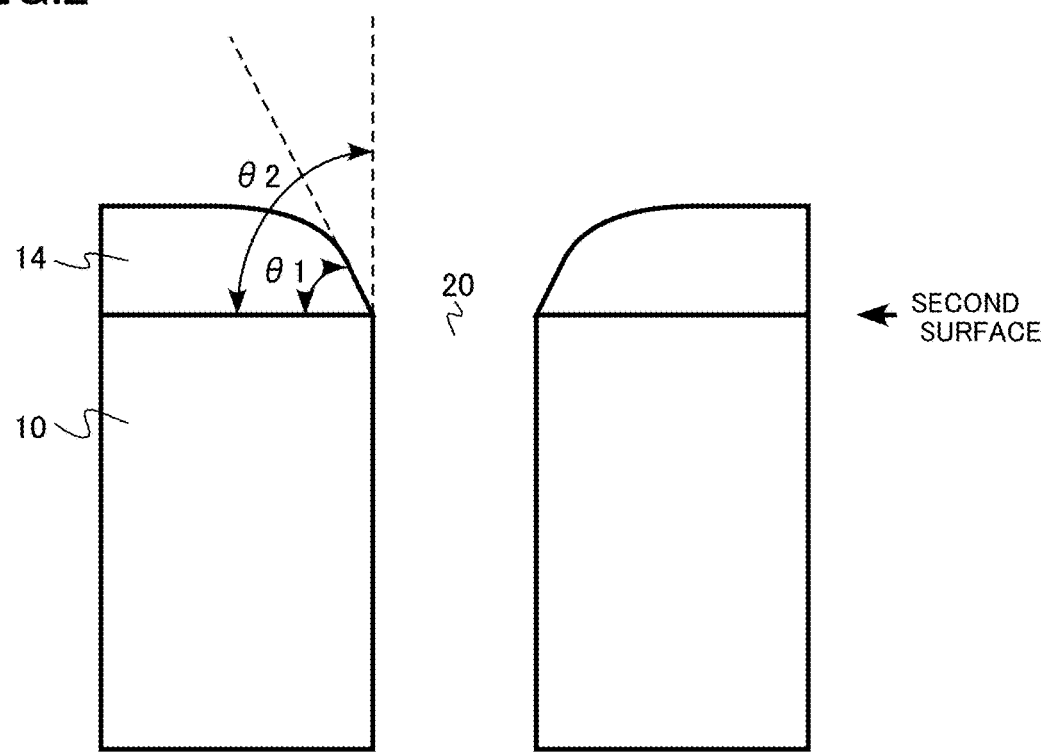

— METAL FILM
— SILICON SUBSTRATE

— METAL FILM
— SILICON SUBSTRATE

— METAL FILM
— SILICON SUBSTRATE

— METAL FILM

— METAL FILM

METAL FILM
SILICON SUBSTRATE

METAL FILM
SILICON SUBSTRATE

METAL FILM

DEVICE MANUFACTURING METHOD AND DEVICE

CROSS-REFERENCE TO RELATED APPLICATION

This application is based upon and claims the benefit of priority from Japanese Patent Application No. 2014-231873, filed on Nov. 14, 2014, Japanese Patent Application No. 2015-014569, filed on Jan. 28, 2015, Japanese Patent Application No. 2014-231874, filed on Nov. 14, 2014, and Japanese Patent Application No. 2014-231875, filed on Nov. 14, 2014, the entire contents of which are incorporated herein by reference.

FIELD

Embodiments described herein relate generally to a device manufacturing method, and a device.

BACKGROUND

Semiconductor devices formed on a semiconductor substrate such as a wafer are divided into semiconductor chips by dicing along dicing regions formed on the semiconductor substrate. In a case where a metal film to be the electrodes of the semiconductor devices, or a resin film such as a die bonding film is formed on one surface of the semiconductor substrate, the metal film or the resin film in the dicing regions also needs to be removed at the time of dicing.

As a method of removing the metal film or the resin film, there is a method of removing a metal film or a resin film at the same time as a semiconductor substrate by blade dicing, for example. In this case, shape abnormalities such as protrusions (burrs) are likely to occur on the metal film or the resin film. Where the metal film or the resin film has shape abnormalities, the semiconductor chips might fail the external appearance test, or junction defects might occur between beds and the semiconductor chips. As a result, the production yield becomes lower.

BRIEF DESCRIPTION OF THE DRAWINGS

FIG. 2 is a schematic cross-sectional view of a device to be manufactured by the device manufacturing method according to the first embodiment;

DETAILED DESCRIPTION

Figure 1A:
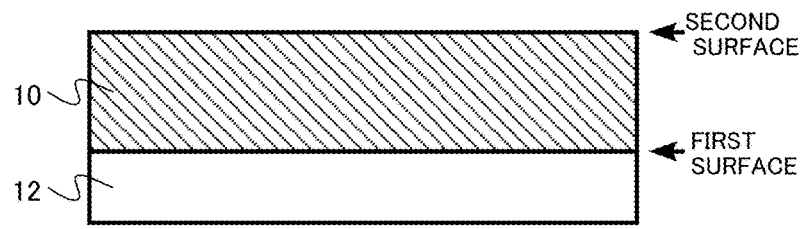
FIGS. 1A, 1B, 1C, 1D, 1E, 1F, and 1G are schematic cross-sectional diagrams showing a device manufacturing method according to a first embodiment.

A device manufacturing method according to an embodiment includes: forming a film on a substrate having a first surface and a second surface, the film being formed on the second surface side of the substrate; forming a trench in part of the substrate from the first surface side of the substrate, while leaving the film to remain; and removing the film at a portion on the second surface side of the trench by injecting a substance onto the film from the second surface side of the substrate.

The following is a description of embodiments, with reference to the accompanying drawings. In the description below, like or similar components are denoted by like reference numerals, and explanation of components described once will not be repeated.

First Embodiment

A device manufacturing method according to this embodiment includes: forming a film on the second surface side of a substrate having a first surface and the second surface; forming a trench in part of the substrate from the first surface side, while leaving the film to remain; and injecting or spraying a substance onto the film from the second surface side, to remove the film at the portion on the second surface side of the trench.

An example case where the device to be manufactured is a vertical power MOSFET (Metal Oxide Semiconductor Field Effect Transistor) that has metal electrodes on both surfaces and includes silicon (Si) is described below. In this case, the substrate is a semiconductor substrate. The film is a metal film. In the example case described below, the substance to be injected onto the metal film is particles containing carbon dioxide. The particles containing carbon dioxide (hereinafter also referred to simply as carbon dioxide particles) are particles containing carbon dioxide as a principal component. In addition to carbon dioxide, the particles may contain inevitable impurities, for example.

FIGS. 1A, 1B, 1C, 1D, 1E, 1F, and 1G are schematic cross-sectional diagrams showing the device manufacturing method according to this embodiment.

First, patterns of the base regions, the source regions, the gate insulating films, the gate electrodes, the source electrodes, and the like of vertical MOSFETs (semiconductor devices) are formed on a front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film. The silicon substrate 10 is preferably exposed through the surface of a dicing region formed on the front surface side.

A supporting substrate (a support) 12 is then bonded to the front surface side of the silicon substrate 10 (FIG. 1A). The supporting substrate 12 is quartz glass, for example.

Figure 1B:
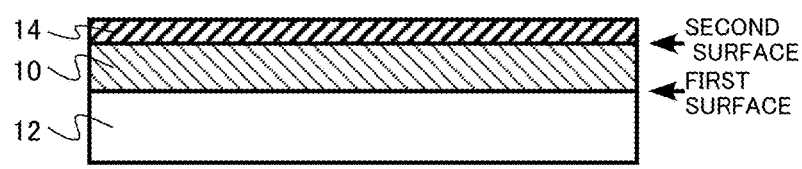

The back surface side of the silicon substrate 10 is ground, so that the silicon substrate 10 becomes thinner. A metal film 14 is then formed on the back surface side of the silicon substrate 10 (FIG. 1B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 μm and not greater than 1.0 μm, for example.

Figure 1C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 1C).

Figure 1D:
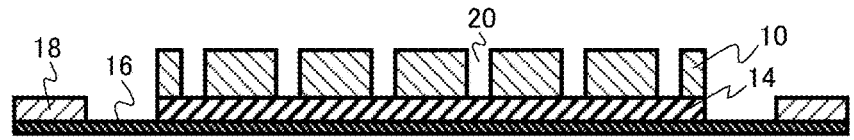

Trenchs 20 are then formed in part of the silicon substrate 10 so that the metal film 14 on the back surface side is exposed through the front surface side along the dicing region formed on the front surface side of the silicon substrate 10 (FIG. 1D). Here, the dicing region is a reserved region having a predetermined width for dividing semiconductor devices into semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape so as to divide the semiconductor devices, for example.

The trenchs 20 are formed by plasma etching, for example. The plasma etching is a so-called Bosch process in which an isotropic etching step using F-based radicals, a protection film forming step using $CF_4$-based radicals, and an anisotropic etching step using F-based ions are repeated, for example.

The trenchs 20 are preferably formed by overall etching without photo resist mask, with the mask being the passivation film on the front surface side of the silicon substrate 10. This method does not involve lithography. Accordingly, the manufacturing process can be simplified, and the costs can be lowered.

Figure 1E:
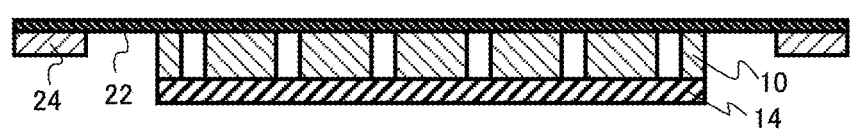

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the passivation film and the metal electrodes on the front surface side. The resin sheet 16 on the back surface side is then removed (FIG. 1E).

Figure 1F:
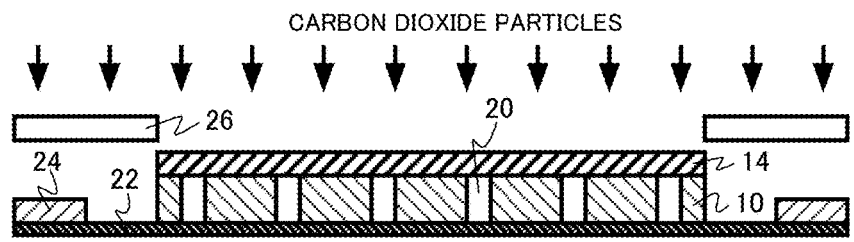
Figure 1G:

Carbon dioxide particles are then injected or sprayed onto the metal film 14 from the back surface side of the silicon substrate 10 (FIG. 1F). As the carbon dioxide particles are injected, the portions of the metal film 14 on the back surface side of the trenchs 20 are removed. By virtue of the carbon dioxide particles, the portions of the metal film 14 are scraped off into the trenchs 20, which are hollow portions in physical terms (FIG. 1G).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the metal film 14. The mean particle size of the carbon dioxide particles is preferably not smaller than 10 μm and not greater than 200 μm. The mean particle size of the carbon dioxide particles can be determined by taking an image of the carbon dioxide particles ejected from the nozzle with a high-speed camera, and measuring the lengths of the particles shown in the taken image, for example. The particle size of one particle is the mean value of the lengths of the long side and the short side of the rectangle circumscribed to the particle shown in the image, for example. The particle sizes of the particles are the particle sizes measured immediately after the particles are ejected from the nozzle.

The spot diameter on the surface of the metal film 14 when the carbon dioxide particles are injected onto the metal film 14 is preferably not smaller than φ3 mm and not greater than φ10 mm, for example.

When the carbon dioxide particles are injected to remove the metal film 14, the region of the resin sheet 22 is preferably covered with a mask 26, as shown in FIG. 1F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided MOSFETs are obtained.

Next, the functions and the effects of the device manufacturing method according to this embodiment are described.

In a case where the metal film 14 is formed on the back surface side of the silicon substrate 10 as in a vertical MOSFET, the metal film 14 on the back surface side in the dicing region also needs to be removed at the time of dicing. In a case where the semiconductor substrate 10 and the metal film 14 are simultaneously removed from the front surface side by blade dicing, for example, the portions of the metal film 14 along the trenchs 20 in the dicing region curl toward the back surface side, and so-called burrs are formed.

If burrs are formed in the metal film 14, there is a possibility that the semiconductor chips will fail the external appearance test, and will not be turned into products, for example. Also, when the semiconductor chips and metal beds are joined with adhesive agents such as solders, there is a possibility that soldering defects will be formed due to degraded adhesive properties at portions with burrs.

In this embodiment, after the trenchs 20 are formed along the dicing region of the silicon substrate 10, carbon dioxide particles are injected onto the metal film 14 from the back surface side, so that the portions of the metal film 14 located over the trenchs 20 are removed. As the removed portions of the metal film 14 are scraped off into the trenchs 20 in the form of hollows, formation of burrs can be restrained. Only the portions of the metal film 14 at the portions corresponding to the trenchs 20 can be removed in a self-aligning manner.

It is considered that the portions of the metal film 14 located over the trenchs 20 are removed by physical impact caused by carbon dioxide particles. In addition to that, it is considered that, as the metal film 14 is rapidly cooled by the low-temperature carbon dioxide particles, and the force generated by gasification and expansion of the carbon dioxide particles that have collided with the metal film 14 is applied, the effect to remove the metal film 14 by physical impact is facilitated.

In a case where the trenchs 20 of the silicon substrate 10 are formed by blade dicing, chipping might occur at the portions of the silicon substrate 10 located around the edges of the trenchs 20 on the back surface side. In this embodiment, on the other hand, the trenchs 20 are formed by plasma etching. Accordingly, chipping at the edges of the trenchs 20 on the back surface side of the silicon substrate 10 can be prevented.

In a case where the trenchs 20 of the silicon substrate 10 are formed by blade dicing, the dicing region needs to have a width equal to or greater than the thickness of the blade. Therefore, a dicing region width of 50 μm or greater is required, for example.

In this embodiment, on the other hand, the trenchs 20 are formed by plasma etching. Accordingly, the width of the dicing region can be reduced. For example, the width of the dicing region can be equal to or greater than 10 μm but smaller than 50 μm, or can even be not greater than 20 μm.

In this embodiment, the metal film or the like is removed by physical impact caused mainly by carbon dioxide particles. Accordingly, even if the metal film is formed with stacked films of different kinds of metals, for example, the metal film can be removed, regardless of the differences in chemical properties among the respective films. This is a different aspect from a case where dry etching is performed. Accordingly, even stacked films of different kinds of metals can be readily removed while shape abnormalities are restrained.

A device to be manufactured by the manufacturing method according to this embodiment is a device formed by dicing a stack structure including a substrate and a metal film provided on one surface of the substrate, and, in this device, the angle of inclination of the edge of the metal film to the surface is smaller than the angle of inclination of a side surface of the substrate to the surface. Also, a device to be manufactured by the manufacturing method according to this embodiment is a device formed by dicing a stack structure including a substrate and a metal film provided on one surface of the substrate, and, in this device, the unevenness in the cut surfaces (side surfaces) of the metal film is smaller than the unevenness in the cut surfaces (side surfaces) of the substrate.

FIG. 2 is a schematic cross-sectional view of a device to be manufactured by the manufacturing method according to this embodiment. This drawing shows the shape of a cross-section of a portion in the vicinity of a trench 20. As shown in FIG. 2, the angle of inclination ($\theta 1$) of the edge portions of the metal film 14 along the trench 20 to the back surface (second surface) is smaller than the angle of inclination ($\theta 2$) of the side surface of the trench 20 to the back surface (second surface).

The edges of the metal film 14 are located further away from the trench 20, compared with the edges of the silicon at the boundary between the silicon substrate 10 and the metal film 14. The edges of the metal film 14 are sloped in the direction away from the trench 20, or in the direction toward the surface of the metal film 14 from the boundary between the silicon substrate 10 and the metal film 14. The slopes become gentler toward the surface of the metal film 14. The corner on the upper side of each edge of the metal film 14 has a curved surface. As the edges of the metal film 14 have the shapes shown in FIG. 2, the junction characteristics at the time of joining the MOSFETs to beds or the like are improved.

Particularly, in a case where the trench 20 is formed by plasma etching as in this embodiment, the unevenness of the cut surface (side surfaces) of the metal film 14 (the edges of the metal film 14 along the trench 20) is smaller than the unevenness of the cut surface (side surfaces) of the silicon substrate 10 (the side surface of the trench 20). In other words, the surface roughness of the edges of the metal film 14 along the trench 20 is smaller than the surface roughness of the side surface of the trench 20.

As described above, this embodiment can provide a device manufacturing method that can reduce shape abnormalities when the metal film is processed.

Second Embodiment

A device manufacturing method according to this embodiment differs from the device manufacturing method according to the first embodiment, in that, instead of a metal film, a semiconductor device including a resin film is manufactured on the back surface side of the silicon substrate 10. In the following, explanation of the same aspects of those of the first embodiment will not be repeated.

An example case where the device to be manufactured is a semiconductor memory that includes a resin film on the back surface side and contains silicon (Si) is described below.

FIGS. 3A, 3B, 3C, 3D, 3E, 3F, and 3G are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film.

Figure 3A:
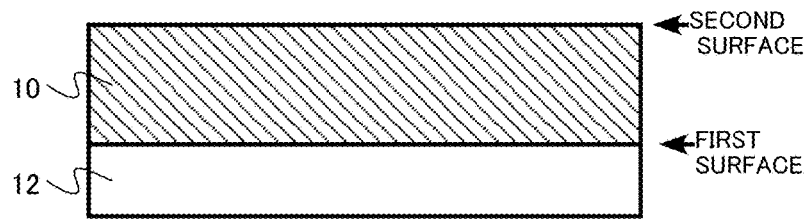
FIGS. 3A, 3B, 3C, 3D, 3E, 3F, and 3G are schematic cross-sectional diagrams showing a device manufacturing method according to a second embodiment.

A supporting substrate 12 is then bonded to the front surface side of the silicon substrate 10 (FIG. 3A). The supporting substrate 12 is quartz glass, for example.

Figure 3B:
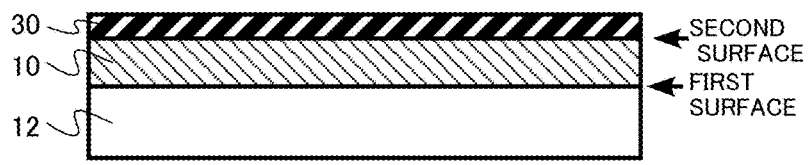

The back surface side of the silicon substrate 10 is ground, so that the silicon substrate 10 becomes thinner. A resin film 30 is then formed on the back surface side of the silicon substrate 10 (FIG. 3B). The resin film 30 is provided substantially on the entire back surface.

The resin film 30 is a DAF (Die Attach Film) for bonding divided semiconductor chips onto the substrate, for example.

The thickness of the resin film 30 is not smaller than 10 μm and not greater than 200 μm, for example.

Figure 3C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the resin film 30. The supporting substrate 12 is then removed from the silicon substrate 10 (FIG. 3C).

Figure 3D:
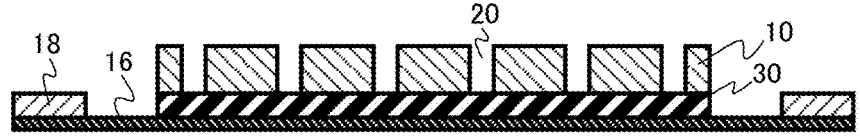

Trenchs 20 are then formed in part of the silicon substrate 10 so that the resin film 30 on the back surface side is exposed through the front surface side along the dicing region formed on the front surface side of the silicon substrate 10 (FIG. 3D). Here, the dicing region is a reserved region having a predetermined width for dividing semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape, for example.

The trenchs 20 are formed by blade dicing, for example.

Figure 3E:
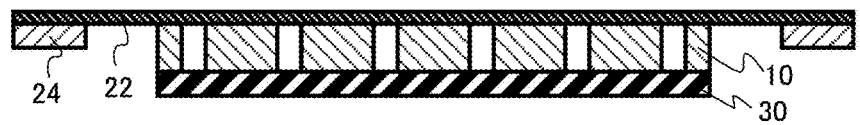

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the passivation film and the metal electrodes on the front surface side. The resin sheet 16 on the back surface side is then removed (FIG. 3E).

Figure 3F:
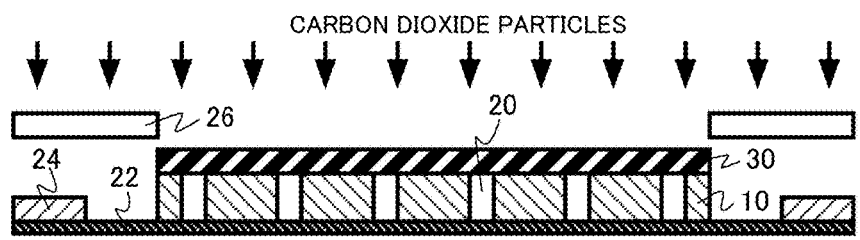
Figure 3G:

Carbon dioxide particles are then injected onto the resin film 30 from the back surface side of the silicon substrate 10 (FIG. 3F). As the carbon dioxide particles are injected, the portions of the resin film 30 on the back surface side of the trenchs 20 are removed. By virtue of the carbon dioxide particles, the portions of the resin film 30 are scraped off into the trenchs 20, which are hollow portions in physical terms (FIG. 3G).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are ejected together with a nitrogen gas from a nozzle, for example, and are injected onto the resin film 30. The mean particle size of the carbon dioxide particles is preferably not smaller than 10 μm and not greater than 200 μm. The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the resin film 30 when the carbon dioxide particles are injected onto the resin film 30 is preferably not smaller than φ3 mm and not greater than φ10 mm, for example.

When the carbon dioxide particles are injected to remove the resin film 30, the region of the resin sheet 22 is preferably covered with a mask 26, as shown in FIG. 3F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided semiconductor memories are obtained.

Next, the functions and the effects of the device manufacturing method according to this embodiment are described.

In a semiconductor device, like a semiconductor memory to be used in a small-sized electronic apparatus such as a portable telephone, a BGA (Ball Grid Array) or an MCP (Multi Chip Package), which is a small-sized, thin semiconductor package, is used. In a BGA or an MCP, a film-type die bonding material such as DAF is used, instead of a paste-like die bonding material.

In a case where the resin film 30 such as DAF is formed on the back surface side of the silicon substrate 10, the resin film 30 on the back surface side in the dicing region also needs to be removed at the time of dicing. For example, in a case where the semiconductor substrate 10 and the resin film 30 are simultaneously removed from the front surface side by blade dicing, the resin film 30 might come off the edges of the trenches 20 in the dicing region, or the cut surfaces of the resin film 30 might not have linear surfaces but have irregular shapes.

In this embodiment, after the trenches 20 are formed along the dicing region of the silicon substrate 10, carbon dioxide particles are injected onto the resin film 30 from the back surface side, so that the portions of the resin film 30 located over the trenches 20 are removed. As the removed portions of the resin film 30 are scraped off into the trenches 20 in the form of hollows, peeling of the resin film 30 can be restrained. Also, the cut surfaces of the resin film 30 are linear surfaces.

It is considered that the portions of the resin film 30 located over the trenches 20 are removed by physical impact caused by carbon dioxide particles. In addition to that, it is considered that, as the resin film 30 is rapidly cooled by the low-temperature carbon dioxide particles, and the force generated by gasification and expansion of the carbon dioxide particles that have collided with the resin film 30 is applied, the effect to remove the resin film 30 by physical impact is facilitated.

A device to be manufactured by the manufacturing method according to this embodiment is a device formed by dicing a stack structure including a substrate and a resin film provided on one surface of the substrate, and, in this device, the angle of inclination of the edge of the resin film to the surface is smaller than the angle of inclination of a side surface of the substrate to the surface. Also, a device to be manufactured by the manufacturing method according to this embodiment is a device formed by dicing a stack structure including a substrate and a resin film provided on one surface of the substrate, and, in this device, the unevenness in the cut surfaces (side surfaces) of the resin film is smaller than the unevenness (side surfaces) in the cut surfaces of the substrate.

As described above, this embodiment can provide a device manufacturing method that can reduce shape abnormalities when the resin film is processed.

Third Embodiment

A device manufacturing method according to this embodiment is the same as the device manufacturing method according to the first embodiment, except that pressurized water is used, instead of carbon dioxide particles. In the following, explanation of the same aspects of those of the first embodiment will not be repeated.

In this embodiment, pressurized water is injected onto the metal film 14 from the back surface side of the silicon substrate 10. As the pressurized water is injected, the portions of the metal film 14 on the back surface side of the trenchs 20 are removed. By virtue of the pressurized water, the portions of the metal film 14 are scraped off into the trenchs 20, which are hollow portions in physical terms.

As described above, this embodiment can also provide a device manufacturing method that can reduce shape abnormalities when the metal film is processed.

Fourth Embodiment

A device manufacturing method according to this embodiment is the same as the device manufacturing method according to the first embodiment, except that pressurized water containing abrasive grains is used, instead of carbon dioxide particles. In the following, explanation of the same aspects of those of the first embodiment will not be repeated.

In this embodiment, pressurized water containing abrasive grains is injected onto the metal film 14 from the back surface side of the silicon substrate 10. As the pressurized water containing abrasive grains is injected, the portions of the metal film 14 on the back surface side of the trenchs 20 are removed. By virtue of the pressurized water containing abrasive grains, the portions of the metal film 14 are scraped off into the trenchs 20, which are hollow portions in physical terms. This process is so-called abrasive jet machining.

The abrasive grains are alumina particles, silicon carbide particles, or silica particles, for example.

As described above, this embodiment can also provide a device manufacturing method that can reduce shape abnormalities when the metal film is processed.

Fifth Embodiment

A device manufacturing method according to this embodiment differs from the device manufacturing method according to the first embodiment, in that part of the substrate remains when a trench is formed at a portion of the substrate. In the following, explanation of the same aspects of those of the first embodiment will not be repeated.

FIGS. 4A, 4B, 4C, 4D, 4E, 4F, and 4G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film. The silicon substrate 10 is preferably exposed through the surface of a dicing region formed on the front surface side.

Figure 4A:
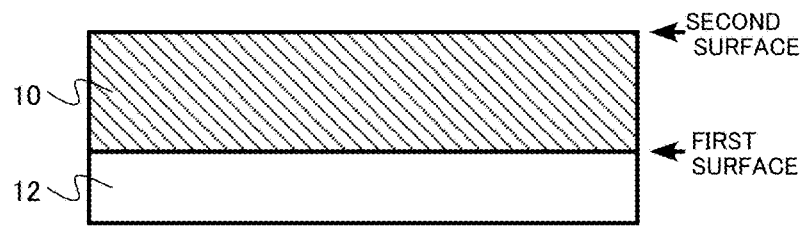
FIGS. 4A, 4B, 4C, 4D, 4E, 4F, and 4G are schematic cross-sectional diagrams showing a device manufacturing method according to a fifth embodiment.

A supporting substrate (a support) 12 is then bonded to the front surface side of the silicon substrate (FIG. 4A). The supporting substrate 12 is quartz glass, for example.

Figure 4B:
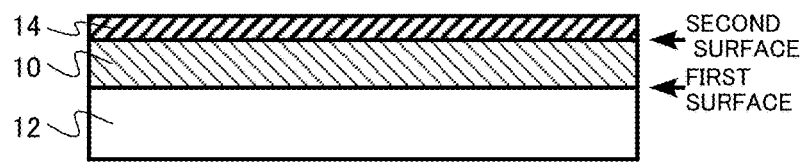

The back surface side of the silicon substrate 10 is ground, so that the silicon substrate 10 becomes thinner. A metal film 14 is then formed on the back surface side of the silicon substrate 10 (FIG. 4B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 4C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 4C).

Figure 4D:
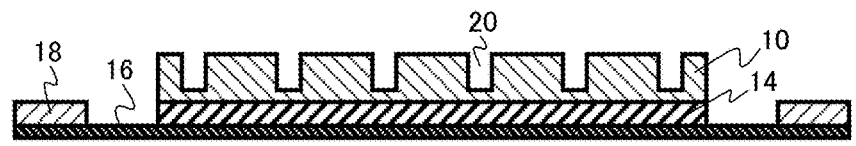

Trenches 20 extending from the front surface side are then formed in part of the silicon substrate 10 along the dicing region formed on the front surface side of the silicon substrate 10 (FIG. 4D). At the time of forming the trenches 20, the trenches 20 are formed so that part of the silicon substrate 10 on the back surface side remains. The semiconductor substrate on the back surface side of the trenches 20 is made to remain with a thickness of 20 µm or less, or more preferably, 10 µm or less.

Here, the dicing region is a reserved region having a predetermined width for dividing semiconductor devices into semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape so as to divide the semiconductor devices, for example.

The trenchs 20 are formed by blade dicing, for example. The trenchs 20 can also be formed by plasma etching, for example.

Figure 4E:
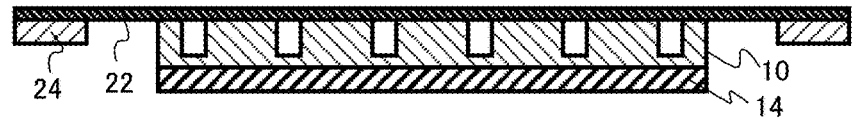

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the passivation film and the metal electrodes on the front surface side. The resin sheet 16 on the back surface side is then removed (FIG. 4E).

Figure 4F:
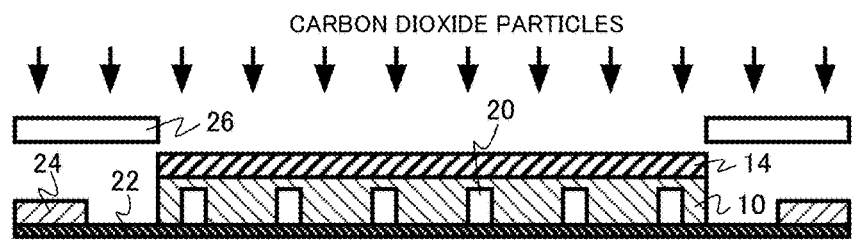
Figure 4G:
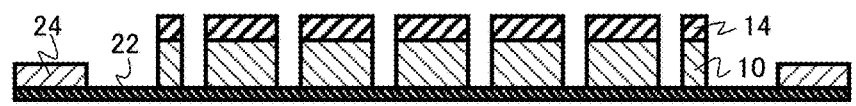

Carbon dioxide particles are then injected onto the metal film 14 from the back surface side of the silicon substrate 10 (FIG. 4F). As the carbon dioxide particles are injected, the portions of the metal film 14 on the back surface side of the trenchs 20, and the silicon substrate 10 are removed. By virtue of the carbon dioxide particles, the portions of the metal film 14 and the silicon substrate 10 are scraped off into the trenchs 20, which are hollow portions in physical terms (FIG. 4G).

When the carbon dioxide particles are injected to remove the metal film 14 and the silicon substrate 10, the region of the resin sheet 22 is preferably covered with a mask 26, as shown in FIG. 4F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided MOSFETs are obtained.

As described above, this embodiment can provide a device manufacturing method that can reduce shape abnormalities when the metal film is processed.

Sixth Embodiment

A device manufacturing method according to this embodiment differs from the device manufacturing method according to the second embodiment, in that part of the substrate remains when a trench is formed at a portion of the substrate. In the following, explanation of the same aspects of those of the second embodiment will not be repeated.

FIGS. 5A, 5B, 5C, 5D, 5E, 5F, and 5G are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film.

Figure 5A:
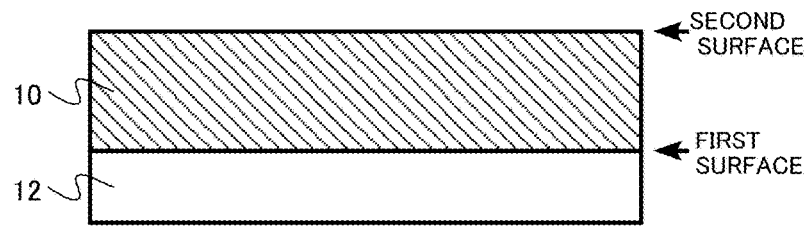
FIGS. 5A, 5B, 5C, 5D, 5E, 5F, and 5G are schematic cross-sectional diagrams showing a device manufacturing method according to a sixth embodiment.

A supporting substrate 12 is then bonded to the front surface side of the silicon substrate 10 (FIG. 5A). The supporting substrate 12 is quartz glass, for example.

Figure 5B:
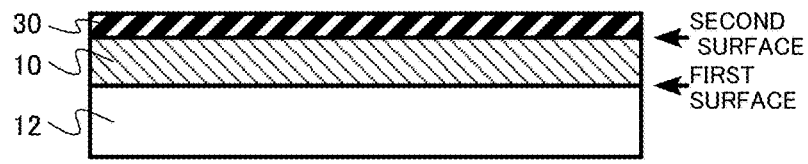

The back surface side of the silicon substrate 10 is ground, so that the silicon substrate 10 becomes thinner. A resin film 30 is then formed on the back surface side of the silicon substrate 10 (FIG. 5B). The resin film 30 is provided substantially on the entire back surface.

The resin film 30 is a DAF (Die Attach Film) for bonding divided semiconductor chips onto the substrate, for example. The thickness of the resin film 30 is not smaller than 10 µm and not greater than 200 µm, for example.

Figure 5C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the resin film 30. The supporting substrate 12 is then removed from the silicon substrate 10 (FIG. 5C).

Figure 5D:
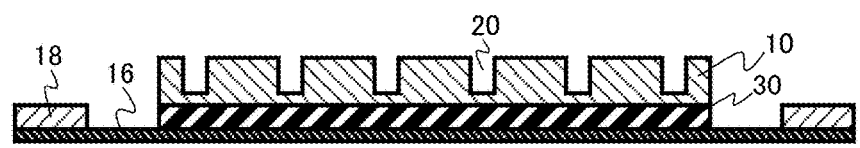

Trenches 20 extending from the front surface side are then formed in part of the silicon substrate 10 along the dicing region formed on the front surface side of the silicon substrate 10 (FIG. 5D). At the time of forming the trenches 20, the trenches 20 are formed so that part of the silicon substrate 10 on the back surface side remains. The semiconductor substrate on the back surface side of the trenches 20 is made to remain with a thickness of 20 µm or less, or more preferably, 10 µm or less.

Here, the dicing region is a reserved region having a predetermined width for dividing semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape, for example.

The trenches 20 are formed by blade dicing, for example. The trenches 20 can also be formed by plasma etching, for example.

Figure 5E:

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the passivation film and the metal electrodes on the front surface side. The resin sheet 16 on the back surface side is then removed (FIG. 5E).

Figure 5F:
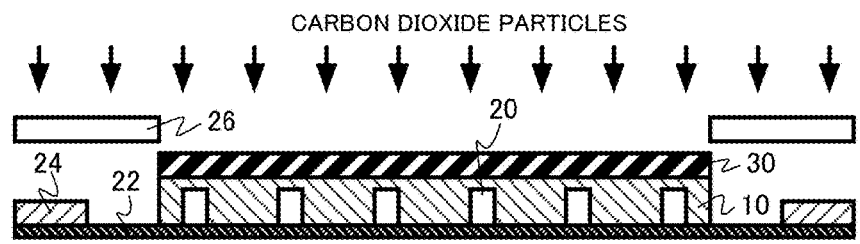
Figure 5G:

Carbon dioxide particles are then injected onto the resin film 30 from the back surface side of the silicon substrate 10 (FIG. 5F). As the carbon dioxide particles are injected, the portions of the resin film 30 on the back surface side of the trenches 20, and the silicon substrate 10 are removed. By virtue of the carbon dioxide particles, the portions of the resin film 30 are scraped off into the trenches 20, which are hollow portions in physical terms (FIG. 5G).

When the carbon dioxide particles are injected to remove the resin film 30, the region of the resin sheet 22 is preferably covered with a mask 26, as shown in FIG. 5F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided semiconductor memories are obtained.

As described above, this embodiment can provide a device manufacturing method that can reduce shape abnormalities when the resin film is processed.

Seventh Embodiment

A device manufacturing method according to this embodiment differs from the device manufacturing method according to the first embodiment, in that part of the film is removed when a trench is formed at a portion of the film. In the following, explanation of the same aspects of those of the first embodiment will not be repeated.

FIGS. 6A, 6B, 6C, 6D, 6E, 6F, and 6G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film. The silicon substrate 10 is preferably exposed through the surface of a dicing region formed on the front surface side.

Figure 6A:
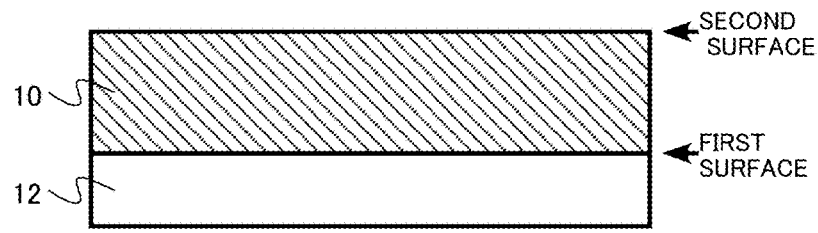
FIGS. 6A, 6B, 6C, 6D, 6E, 6F, and 6G are schematic cross-sectional diagrams showing a device manufacturing method according to a seventh embodiment.

A supporting substrate (a support) 12 is then bonded to the front surface side of the silicon substrate 10 (FIG. 6A). The supporting substrate 12 is quartz glass, for example.

Figure 6B:
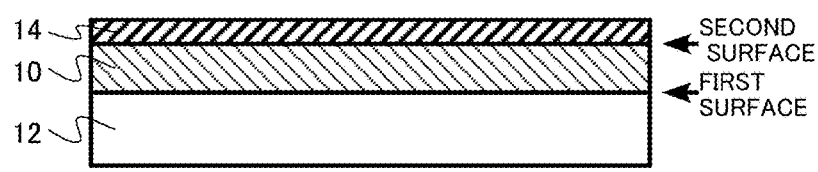

The back surface side of the silicon substrate 10 is ground, so that the silicon substrate 10 becomes thinner. A metal film 14 is then formed on the back surface side of the silicon substrate 10 (FIG. 6B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 µm and not greater than 1.0 µm, for example.

Figure 6C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 6C).

Figure 6D:
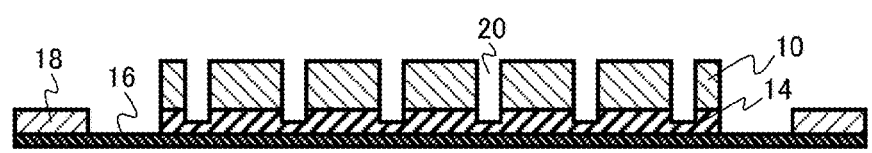

Trenchs 20 extending from the front surface side are then formed in part of the silicon substrate 10 along the dicing region formed on the front surface side of the silicon substrate 10 (FIG. 6D). At the time of forming the trenchs 20, the trenchs 20 are formed so that part of the metal film 14 on the back surface side is removed.

Here, the dicing region is a reserved region having a predetermined width for dividing semiconductor devices into semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape so as to divide the semiconductor devices, for example.

The trenchs 20 are formed by blade dicing, for example. The trenchs 20 can also be formed by plasma etching, for example.

Figure 6E:
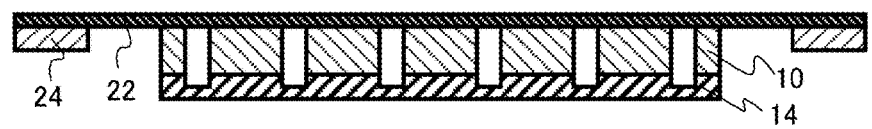

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the passivation film and the metal electrodes on the front surface side. The resin sheet 16 on the back surface side is then removed (FIG. 6E).

Figure 6F:
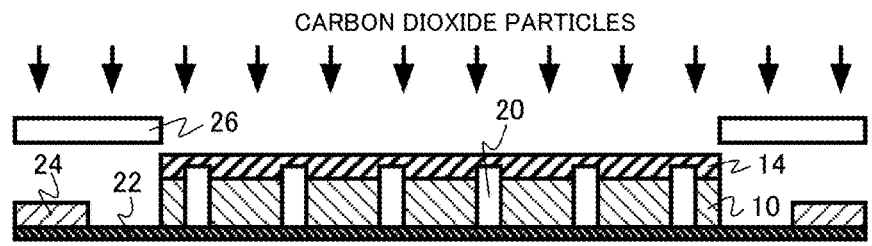
Figure 6G:

Carbon dioxide particles are then injected onto the metal film 14 from the back surface side of the silicon substrate 10 (FIG. 6F). As the carbon dioxide particles are injected, the portions of the metal film 14 on the back surface side having the trenchs 20 are removed. By virtue of the carbon dioxide particles, the portions of the metal film 14 are scraped off into the trenchs 20, which are hollow portions in physical terms (FIG. 6G).

When the carbon dioxide particles are injected to remove the metal film 14, the region of the resin sheet 22 is preferably covered with a mask 26, as shown in FIG. 6F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided MOSFETs are obtained.

As described above, this embodiment can provide a device manufacturing method that can reduce shape abnormalities when the metal film is processed.

Eighth Embodiment

A device manufacturing method according to this embodiment differs from the device manufacturing method according to the second embodiment, in that part of the film is removed when a trench is formed at a portion of the film. In the following, explanation of the same aspects of those of the second embodiment will not be repeated.

FIGS. 7A, 7B, 7C, 7D, 7E, 7F, and 7G are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film.

Figure 7A:
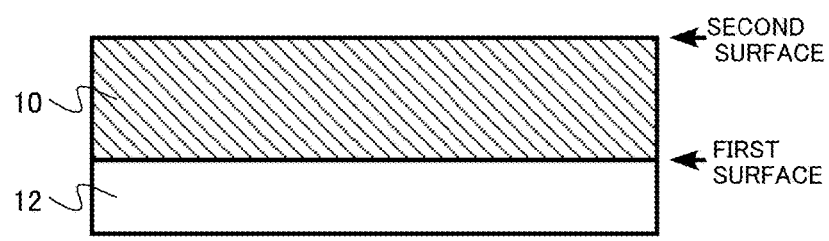
FIGS. 7A, 7B, 7C, 7D, 7E, 7F, and 7G are schematic cross-sectional diagrams showing a device manufacturing method according to an eighth embodiment.

A supporting substrate 12 is then bonded to the front surface side of the silicon substrate 10 (FIG. 7A). The supporting substrate 12 is quartz glass, for example.

Figure 7B:
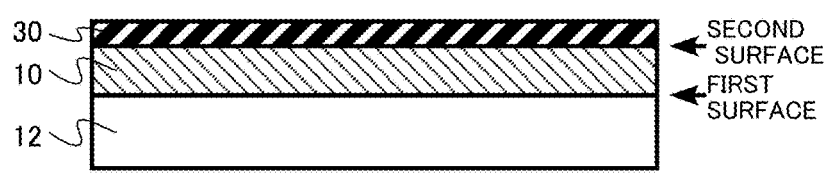

The back surface side of the silicon substrate 10 is ground, so that the silicon substrate 10 becomes thinner. A resin film 30 is then formed on the back surface side of the silicon substrate 10 (FIG. 7B). The resin film 30 is provided substantially on the entire back surface.

The resin film 30 is a DAF (Die Attach Film) for bonding divided semiconductor chips onto the substrate, for example. The thickness of the resin film 30 is not smaller than 10 µm and not greater than 200 µm, for example.

Figure 7C:

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the resin film 30. The supporting substrate 12 is then removed from the silicon substrate 10 (FIG. 7C).

Figure 7D:
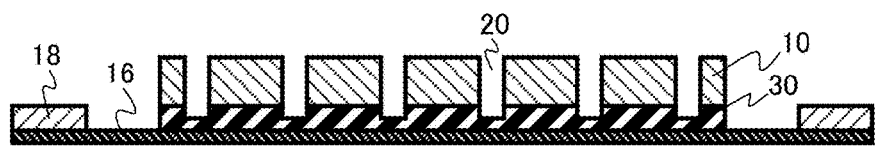

Trenchs 20 extending from the front surface side are then formed in part of the silicon substrate 10 along the dicing region formed on the front surface side of the silicon substrate 10 (FIG. 7D). At the time of forming the trenchs 20, the trenchs 20 are formed so that part of the metal film 14 on the back surface side is removed.

Here, the dicing region is a reserved region having a predetermined width for dividing semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape, for example.

The trenchs 20 are formed by blade dicing, for example. The trenchs 20 can also be formed by plasma etching, for example.

Figure 7E:

A resin sheet 22 is then bonded to the front surface side of the silicon substrate 10. The resin sheet 22 is a so-called dicing sheet. The resin sheet 22 is secured by a metal frame 24, for example. The resin sheet 22 is attached to the surfaces of the passivation film and the metal electrodes on the front surface side. The resin sheet 16 on the back surface side is then removed (FIG. 7E).

Figure 7F:
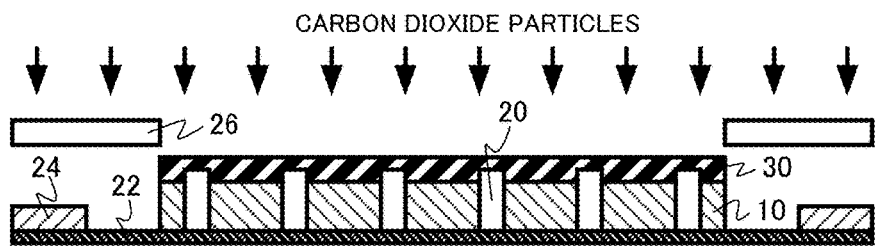
Figure 7G:

Carbon dioxide particles are then injected onto the resin film 30 from the back surface side of the silicon substrate 10 (FIG. 7F). As the carbon dioxide particles are injected, the portions of the resin film 30 on the back surface side having the trenchs 20 are removed. By virtue of the carbon dioxide particles, the portions of the resin film 30 are scraped off into the trenchs 20, which are hollow portions in physical terms (FIG. 7G).

When the carbon dioxide particles are injected to remove the resin film 30, the region of the resin sheet 22 is preferably covered with a mask 26, as shown in FIG. 7F. As the region of the resin sheet 22 is covered with the mask 26, the resin sheet 22 can be prevented from coming off the frame 24 due to the impact caused by the carbon dioxide particles, for example. The mask 26 is made of a metal, for example.

After that, the resin sheet 22 on the front surface side of the silicon substrate 10 is removed. As a result, divided semiconductor memories are obtained.

As described above, this embodiment can provide a device manufacturing method that can reduce shape abnormalities when the resin film is processed.

Although an example case where the trenchs are formed by plasma etching has been described in the first embodiment, the trenchs can also be formed by blade dicing or laser dicing. Although an example case where the trenchs are formed by blade dicing has been described in the second embodiment, the trenchs can also be formed by plasma etching or laser dicing.

Although an example case where the trenchs are formed so that the metal film or the resin film is exposed has been described in each of the first through eighth embodiments, the trenchs can be formed so as to leave part of the substrate. In this case, when a substance is injected onto the metal film or the resin film, the remaining portions of the substrate at the portions corresponding to the trench portions can also be removed at the same time.

Ninth Embodiment

A device manufacturing method according to this embodiment includes: forming a trench in part of a substrate from the side of a first surface of a substrate having the first surface and a second surface; removing the second surface side of the substrate so as to leave the substrate at the portion on the second surface side of the trench; forming a film on the second surface side; and injecting a substance onto the film from the second surface side, to remove the film at the portion on the second surface side of the trench and the substrate at the portion on the second surface side of the trench, and to expose the trench.

An example case where the device to be manufactured is a vertical power MOSFET (Metal Oxide Semiconductor Field Effect Transistor) that has metal electrodes on both surfaces and includes silicon (Si) is described below. In this case, the substrate is a semiconductor substrate. The film is a metal film. In the example case described below, the substance to be injected onto the metal film is particles containing carbon dioxide. The particles containing carbon dioxide (hereinafter also referred to simply as carbon dioxide particles) are particles containing carbon dioxide as a principal component. In addition to carbon dioxide, the particles may contain inevitable impurities, for example.

FIGS. 8A, 8B, 8C, 8D, 8E, 8F, and 8G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film. The silicon substrate 10 is preferably exposed through the surface of a dicing region formed on the front surface side.

Figure 8A:
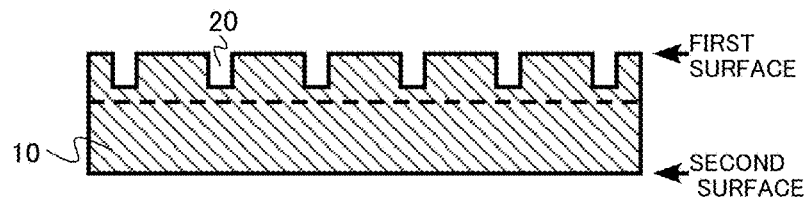
FIGS. 8A, 8B, 8C, 8D, 8E, 8F, and 8G are schematic cross-sectional diagrams showing a device manufacturing method according to a ninth embodiment.

Trenchs 20 extending from the front surface side are then formed in part of the silicon substrate 10 along the dicing region formed on the front surface side of the silicon substrate 10 (FIG. 8A). Here, the dicing region is a reserved region having a predetermined width for dividing semiconductor devices into semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape so as to divide the semiconductor devices, for example.

The trenchs 20 are formed by plasma etching, for example. The plasma etching is a so-called Bosch process in which an isotropic etching step using F-based radicals, a passivation film forming step using $CF_4$-based radicals, and an anisotropic etching step using F-based ions are repeated, for example.

The trenchs 20 are preferably formed by overall etching, with the mask being the passivation film on the front surface side of the silicon substrate 10. This method does not involve lithography. Accordingly, the manufacturing process can be simplified, and the costs can be lowered.

The formation of the trenchs 20 is so-called DBG (Dicing Before Grinding) by which trenchs are formed in the dicing region from the front surface side prior to back surface grinding. The trenchs 20 are designed to be shallower than the grinding position (indicated by the dashed lines in FIGS. 8A and 8B) to be ground later in the back surface grinding. In other words, the depth of the trenchs 20 is set so that the semiconductor substrate 10 will remain on the back surface side of the trenchs 20 after the back surface grinding.

Figure 8B:
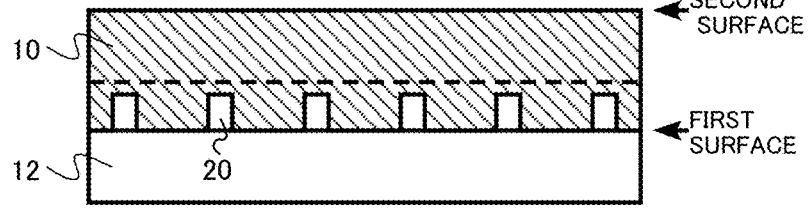

A supporting substrate (a support) 12 is then bonded to the front surface side of the silicon substrate 10 with an adhesive layer (not shown) (FIG. 8B). The supporting substrate 12 is quartz glass, for example.

Figure 8C:
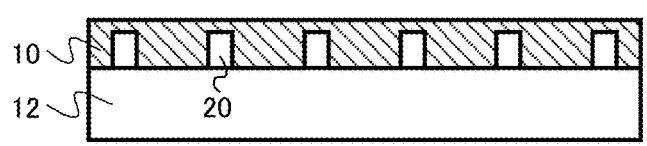

The back surface side of the silicon substrate 10 is ground, so that the silicon substrate 10 becomes thinner (FIG. 8C). At this point, the semiconductor substrate 10 at portions on the back surface side of the trenchs 20 is made to remain. The semiconductor substrate on the back surface side of the trenchs 20 is made to remain with a thickness of 20 μm or less, or more preferably, 10 μm or less.

Figure 8D:
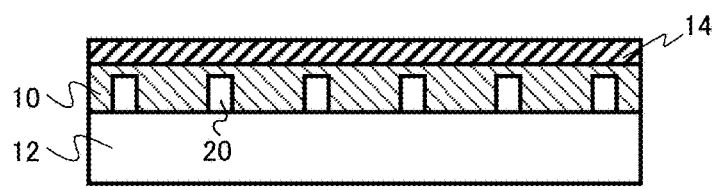

A metal film 14 is then formed on the back surface side of the silicon substrate 10 (FIG. 8D). The metal film 14 is provided substantially on the entire back surface. At this point, the silicon substrate 10 exists on the back surface side of the trenchs 20, and accordingly, the metal film 14 is not formed in the trenchs 20.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 μm and not greater than 1.0 μm, for example.

Figure 8E:
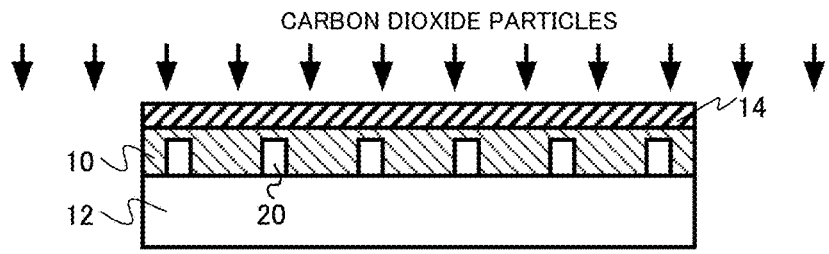
Figure 8F:
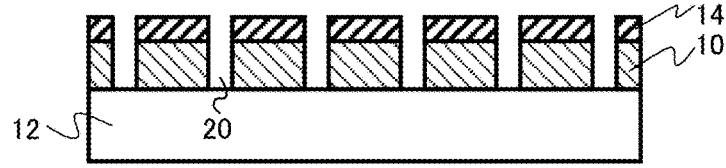

Carbon dioxide particles are then injected onto the metal film 14 from the back surface side of the silicon substrate 10 (FIG. 8E). As the carbon dioxide particles are injected, the portions of the metal film 14 on the back surface side of the trenchs 20, and the silicon substrate 10 at the portions on the back surface side of the trenchs 20 are removed, so that the trenchs 20 are exposed. By virtue of the carbon dioxide particles, the portions of the metal film 14 and the silicon substrate 10 are scraped off into the trenchs 20, which are hollow portions in physical terms (FIG. 8F).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the metal film 14. The mean particle size of the carbon dioxide particles is preferably not smaller than 10 μm and not greater than 200 μm. The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the metal film 14 when the carbon dioxide particles are injected onto the metal film 14 is preferably not smaller than φ3 mm and not greater than φ10 mm, for example.

Figure 8G:
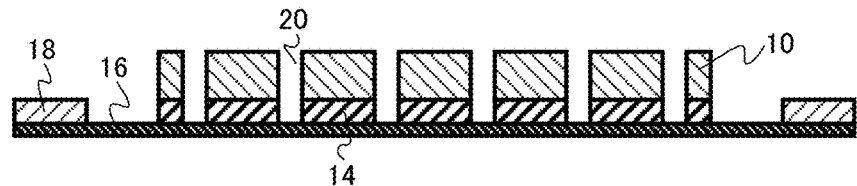

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the metal film 14. The supporting substrate 12 is then removed from the silicon substrate 10 (FIG. 8G).

After that, the resin sheet 16 on the front surface side of the silicon substrate 10 is removed. As a result, divided MOSFETs are obtained.

Next, the functions and the effects of the device manufacturing method according to this embodiment are described.

In a case where the metal film 14 is also formed on the back surface side of the silicon substrate 10 as in a vertical MOSFET, the metal film 14 on the back surface side in the dicing region also needs to be removed at the time of dicing. In a case where the semiconductor substrate 10 and the metal film 14 are simultaneously removed from the front surface side by blade dicing, for example, the portions of the metal film 14 along the trenchs 20 in the dicing region curl toward the back surface side, and so-called burrs are formed.

If burrs are formed in the metal film 14, there is a possibility that the semiconductor chips will fail the external appearance test, and will not be turned into products, for example. Also, when the semiconductor chips and metal beds are joined with adhesive agents such as solders, there is a possibility that soldering defects will be formed due to degraded adhesive properties at portions with burrs.

In this embodiment, after the trenchs 20 are formed along the dicing region of the silicon substrate 10, carbon dioxide particles are injected onto the metal film 14 from the back surface side, so that the portions of the metal film 14 located over the trenchs 20, and the silicon substrate 10 are removed. As the removed portions of the metal film 14 and the silicon substrate 10 are scraped off into the trenchs 20 in the form of hollows, formation of burrs can be restrained. Only the portions of the metal film 14 and the silicon substrate 10 at the portions corresponding to the trenchs 20 can be removed in a self-aligning manner.

It is considered that the portions of the metal film 14 located over the trenchs 20, and the silicon substrate 10 are removed by physical impact caused by carbon dioxide particles. In addition to that, it is considered that, as the metal film 14 and the silicon substrate 10 are rapidly cooled by the low-temperature carbon dioxide particles, and the force generated by gasification and expansion of the carbon dioxide particles that have collided with the metal film 14 and the silicon substrate 10 is applied, the effect to remove the metal film 14 and the silicon substrate 10 by physical impact is facilitated.

In a case where the trenchs 20 of the silicon substrate 10 are formed by blade dicing, the dicing region needs to have a width equal to or greater than the thickness of the blade. Therefore, a dicing region width of 50 μm or greater is required, for example.

In this embodiment, on the other hand, the trenchs 20 are formed by plasma etching. Accordingly, the width of the dicing region can be reduced. For example, the width of the dicing region can be equal to or greater than 10 μm but smaller than 50 μm, or can even be not greater than 20 μm.

In this embodiment, the metal film or the like is removed by physical impact caused mainly by carbon dioxide particles. Accordingly, even if the metal film is formed with stacked films of different kinds of metals, for example, the metal film can be removed, regardless of the differences in chemical properties among the respective films. This is a different aspect from a case where dry etching is performed. Accordingly, even stacked films of different kinds of metals can be readily removed while shape abnormalities are restrained.

Figure 9:
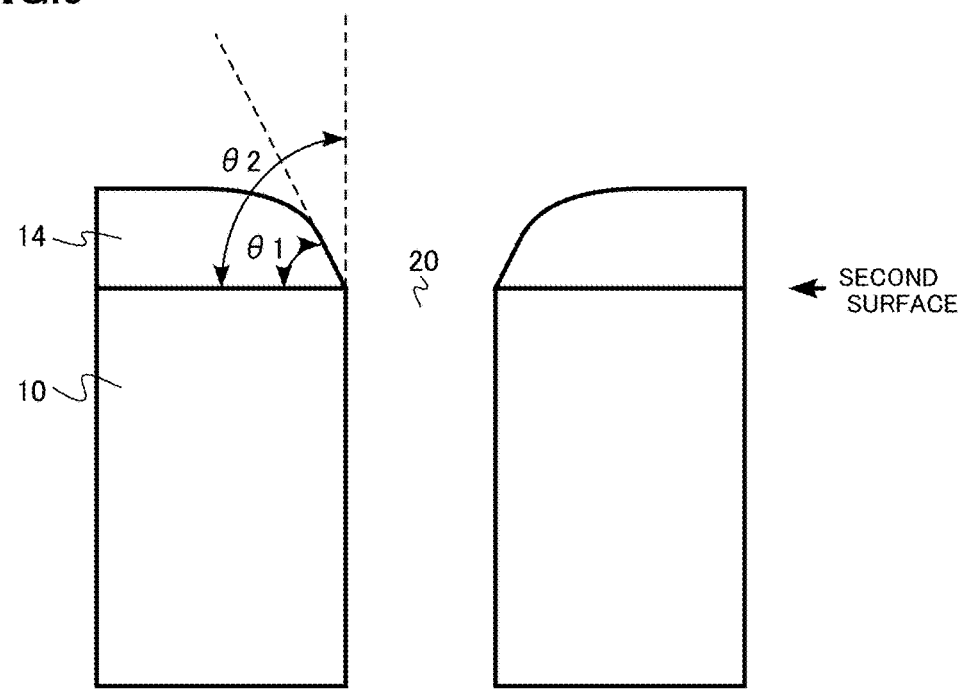
FIG. 9 is a schematic cross-sectional view of a device to be manufactured by the device manufacturing method according to the ninth embodiment.

FIG. 9 is a schematic cross-sectional view of a device to be manufactured by the manufacturing method according to this embodiment. This drawing shows the shape of a cross-section of a portion in the vicinity of a trench 20. As shown in FIG. 9, the angle of inclination (θ1) of the edge portions of the metal film 14 along the trench 20 to the back surface (second surface) is smaller than the angle of inclination (θ2) of the side surface of the trench 20 to the back surface (second surface).

The edges of the metal film 14 are located further away from the trench 20, compared with the edges of the silicon at the boundary between the silicon substrate 10 and the metal film 14. The edges of the metal film 14 are sloped in the direction away from the trench 20, or in the direction toward the surface of the metal film 14 from the boundary between the silicon substrate 10 and the metal film 14. The slopes become gentler toward the surface of the metal film 14. The corner on the upper side of each edge of the metal film 14 has a curved surface. As the edges of the metal film 14 have the shapes shown in FIG. 9, the junction characteristics at the time of joining the MOSFET to a bed or the like are improved.

Particularly, in a case where the trench 20 is formed by plasma etching as in this embodiment, the unevenness of the edges of the metal film 14 along the trench 20 is smaller than the unevenness of the side surface of the trench 20 in the silicon substrate 10. In other words, the surface roughness of the edges of the metal film 14 along the trench 20 is smaller than the surface roughness of the side surface of the trench 20.

As described above, this embodiment can provide a device manufacturing method that can reduce shape abnormalities when the metal film is processed.

Tenth Embodiment

A device manufacturing method according to this embodiment differs from the device manufacturing method according to the ninth embodiment, in that, instead of a metal film, a semiconductor device including a resin film is manufactured on the back surface side of the silicon substrate 10. In the following, explanation of the same aspects of those of the ninth embodiment will not be repeated.

An example case where the device to be manufactured is a semiconductor memory that includes a resin film on the back surface side and contains silicon (Si) is described below.

FIGS. 10A, 10B, 10C, 10D, 10E, 10F, and 10G are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film.

Figure 10A:
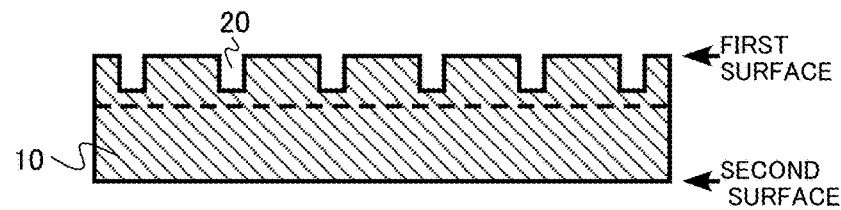
FIGS. 10A, 10B, 10C, 10D, 10E, 10F, and 10G are schematic cross-sectional diagrams showing a device manufacturing method according to a tenth embodiment.

Trenchs 20 extending from the front surface side are then formed in part of the silicon substrate 10 along the dicing region formed on the front surface side of the silicon substrate 10 (FIG. 10A). Here, the dicing region is a reserved region having a predetermined width for dividing semiconductor devices into semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape so as to divide the semiconductor devices, for example.

The trenches 20 are formed by blade dicing, for example.

The formation of the trenches 20 is so-called DBG (Dicing Before Grinding) by which trenches are formed in the dicing region from the front surface side prior to back surface grinding. The trenches 20 are designed to be shallower than the grinding position (indicated by the dashed lines in FIGS. 10A and 10B) to be ground later in the back surface grinding. In other words, the depth of the trenches 20 is set so that the semiconductor substrate 10 will remain on the back surface side of the trenches 20 after the back surface grinding.

Figure 10B:
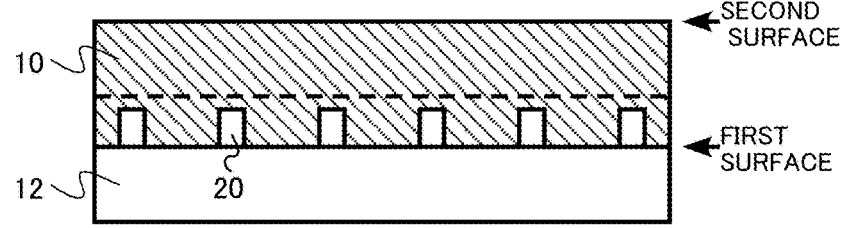

A supporting substrate (a support) 12 is then bonded to the front surface side of the silicon substrate 10 with an adhesive layer (not shown) (FIG. 10B). The supporting substrate 12 is quartz glass, for example.

Figure 10C:
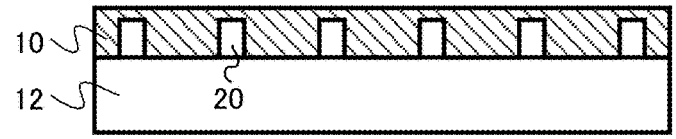

The back surface side of the silicon substrate 10 is ground, so that the silicon substrate 10 becomes thinner (FIG. 10C). At this point, the semiconductor substrate 10 at portions on the back surface side of the trenches 20 is made to remain. The semiconductor substrate on the back surface side of the trenches 20 is made to remain with a thickness of 20 μm or less, or more preferably, 10 μm or less.

Figure 10D:
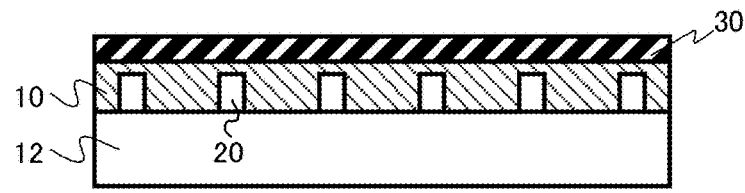

A resin film 30 is then formed on the back surface side of the silicon substrate 10 (FIG. 10D). The resin film 30 is provided substantially on the entire back surface.

The resin film 30 is a DAF (Die Attach Film) for bonding divided semiconductor chips onto the substrate, for example. The thickness of the resin film 30 is not smaller than 10 μm and not greater than 200 μm, for example.

Figure 10E:
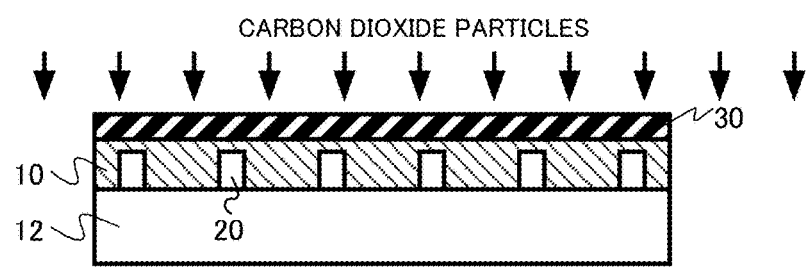
Figure 10F:
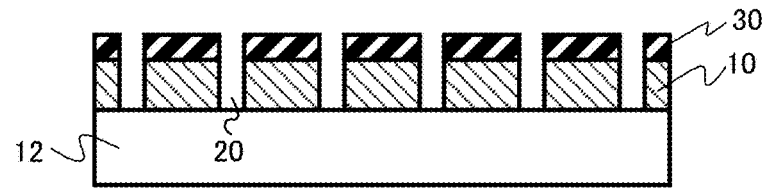

Carbon dioxide particles are then injected onto the resin film 30 from the back surface side of the silicon substrate 10 (FIG. 10E). As the carbon dioxide particles are injected, the resin film 30 at the portions on the back surface side of the trenches 20, and the silicon substrate 10 at the portions on the back surface side of the trenches 20 are removed, so that the trenches 20 are exposed. By virtue of the carbon dioxide particles, the portions of the resin film 30 and the silicon substrate 10 are scraped off into the trenches 20, which are hollow portions in physical terms (FIG. 10F).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the metal film 14. The mean particle size of the carbon dioxide particles is preferably not smaller than 10 μm and not greater than 200 μm.

The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the metal film 14 when the carbon dioxide particles are injected onto the metal film 14 is preferably not smaller than ϕ3 mm and not greater than ϕ10 mm, for example.

Figure 10G:
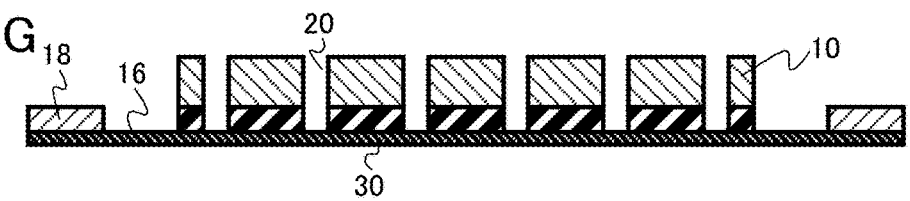

A resin sheet 16 is then bonded to the back surface side of the silicon substrate 10. The resin sheet 16 is a so-called dicing sheet. The resin sheet 16 is secured by a metal frame 18, for example. The resin sheet 16 is attached to the front surface of the resin film 30. The supporting substrate 12 is then removed from the silicon substrate 10 (FIG. 10G).

After that, the resin sheet 16 is removed. As a result, divided semiconductor memories are obtained.

Next, the functions and the effects of the device manufacturing method according to this embodiment are described.

In a semiconductor device, like a semiconductor memory to be used in a small-sized electronic apparatus such as a portable telephone, a BGA (Ball Grid Array) or an MCP (Multi Chip Package), which is a small-sized, thin semiconductor package, is used. In a BGA or an MCP, a film-type die bonding material such as DAF is used, instead of a paste-like die bonding material.

In a case where the resin film 30 such as DAF is formed on the back surface side of the silicon substrate 10, the resin film 30 on the back surface side in the dicing region also needs to be removed at the time of dicing. For example, in a case where the semiconductor substrate 10 and the resin film 30 are simultaneously removed from the front surface side by blade dicing, the resin film 30 might come off the edges of the trenches 20 in the dicing region, or the cut surfaces of the resin film 30 might not have linear surfaces but have irregular shapes.

In this embodiment, after the trenches 20 are formed along the dicing region of the silicon substrate 10, carbon dioxide particles are injected onto the resin film 30 from the back surface side, so that the portions of the resin film 30 located over the trenches 20, and the silicon substrate 10 are removed. As the removed portions of the resin film 30 and the silicon substrate 10 are scraped off into the trenches 20 in the form of hollows, peeling of the resin film 30 can be restrained. Also, the cut surfaces of the resin film 30 are linear surfaces.

It is considered that the portions of the resin film 30 located over the trenches 20, and the silicon substrate 10 are removed by physical impact caused by carbon dioxide particles. In addition to that, it is considered that, as the resin film 30 and the silicon substrate 10 are rapidly cooled by the low-temperature carbon dioxide particles, and the force generated by gasification and expansion of the carbon dioxide particles that have collided with the resin film 30 and the silicon substrate 10 is applied, the effect to remove the resin film 30 and the silicon substrate 10 by physical impact is facilitated.

As described above, this embodiment can provide a device manufacturing method that can reduce shape abnormalities when the resin film is processed.

Eleventh Embodiment

A device manufacturing method according to this embodiment is the same as the device manufacturing method according to the ninth embodiment, except that pressurized water (water jet) is used, instead of carbon dioxide particles. In the following, explanation of the same aspects of those of the ninth embodiment will not be repeated.

In this embodiment, pressurized water is injected onto the metal film 14 from the back surface side of the silicon substrate 10. As the pressurized water is injected, the portions of the metal film 14 on the back surface side of the trenchs 20, and the silicon substrate 10 are removed. By virtue of the pressurized water, the portions of the metal film 14 are scraped off into the trenchs 20, which are hollow portions in physical terms. This process is so-called water jet machining.

As described above, this embodiment can also provide a device manufacturing method that can reduce shape abnormalities when the metal film is processed.

Twelfth Embodiment

A device manufacturing method according to this embodiment is the same as the device manufacturing method according to the ninth embodiment, except that pressurized water containing abrasive grains is used, instead of carbon dioxide particles. In the following, explanation of the same aspects of those of the ninth embodiment will not be repeated.

In this embodiment, pressurized water containing abrasive grains is injected onto the metal film 14 from the back surface side of the silicon substrate 10. As the pressurized water containing abrasive grains is injected, the portions of the metal film 14 on the back surface side of the trenchs 20, and the silicon substrate 10 are removed. By virtue of the pressurized water containing abrasive grains, the portions of the metal film 14 are scraped off into the trenchs 20, which are hollow portions in physical terms. This process is so-called abrasive jet machining.

The abrasive grains are alumina particles, silicon carbide particles, or silica particles, for example.

As described above, this embodiment can also provide a device manufacturing method that can reduce shape abnormalities when the metal film is processed.

Although an example case where the trenchs are formed by plasma etching has been described in the ninth embodiment, the trenchs can also be formed by blade dicing or laser dicing. Although an example case where the trenchs are formed by blade dicing has been described in the tenth embodiment, the trenchs can also be formed by plasma etching or laser dicing.

Thirteenth Embodiment

A device manufacturing method according to this embodiment includes: forming a film on the second surface side of a substrate having a first surface and the second surface; forming a trench in part of the substrate from the first surface side, while leaving the film to remain; and injecting a substance from the first surface side, to remove the film at the portion on the second surface side of the trench.

An example case where the device to be manufactured is a vertical power MOSFET (Metal Oxide Semiconductor Field Effect Transistor) that has metal electrodes on both surfaces and includes silicon (Si) is described below. In this case, the substrate is a semiconductor substrate. The film is a metal film. In the example case described below, the substance to be injected onto the metal film is particles containing carbon dioxide. The particles containing carbon dioxide (hereinafter also referred to simply as carbon dioxide particles) are particles containing carbon dioxide as a principal component. In addition to carbon dioxide, the particles may contain inevitable impurities, for example.

FIGS. 11A, 11B, 11C, 11D, 11E, 11F, and 11G are schematic cross-sectional diagrams showing the device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film. The silicon substrate 10 is preferably exposed through the surface of a dicing region formed on the front surface side.

Figure 11A:
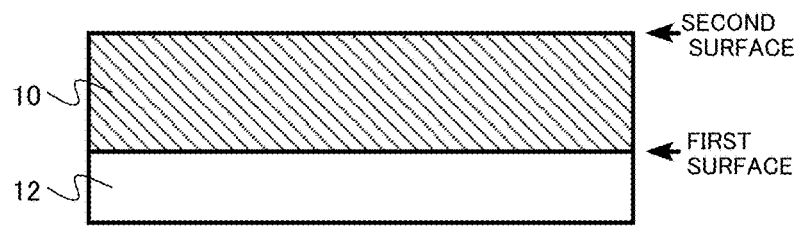
FIGS. 11A, 11B, 11C, 11D, 11E, 11F, and 11G are schematic cross-sectional diagrams showing a device manufacturing method according to a thirteenth embodiment.

A supporting substrate (a support) 12 is then bonded to the front surface side of the silicon substrate 10 (FIG. 11A). The supporting substrate 12 is quartz glass, for example.

Figure 11B:
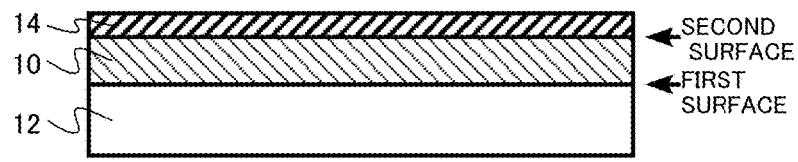

The back surface side of the silicon substrate 10 is ground, so that the silicon substrate 10 becomes thinner. A metal film 14 is then formed on the back surface side of the silicon substrate 10 (FIG. 11B). The metal film 14 is provided substantially on the entire back surface.

The metal film 14 is the drain electrode of the MOSFET. The metal film 14 is formed with stacked films of different kinds of metals, for example. The metal film 14 is formed with stacked films of aluminum, titanium, nickel, and gold in this order from the back surface side of the silicon substrate 10, for example. The metal film 14 is formed by a sputtering technique, for example. The thickness of the metal film 14 is not smaller than 0.5 μm and not greater than 1.0 μm, for example.

Figure 11C:

With the back surface side of the silicon substrate 10 facing downward, the metal film 14, the silicon substrate 10, and the supporting substrate 12 are placed on a tray 36. The silicon substrate 10 is supported by the tray 36 only at the peripheral portion. Other than the peripheral portion, a void exists between the silicon substrate 10 and the tray 36. The peripheral portion of the silicon substrate 10 and the metal film 14 may be secured to the peripheral portion of the tray 36 with an adhesive layer. The supporting substrate 12 is then removed from the silicon substrate 10 (FIG. 11C).

Figure 11D:
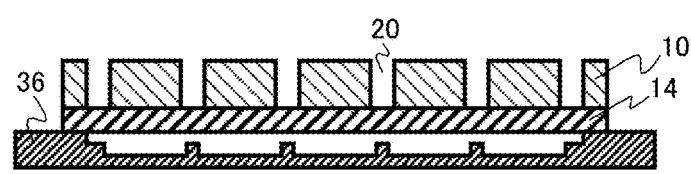

Trenchs 20 are then formed in part of the silicon substrate 10 so that the metal film 14 on the back surface side is exposed through the front surface side along the dicing region formed on the front surface side of the silicon substrate 10 (FIG. 11D). Here, the dicing region is a reserved region having a predetermined width for dividing semiconductor devices into semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape so as to divide the semiconductor devices, for example.

The trenchs 20 are formed by plasma etching, for example. The plasma etching is a so-called Bosch process in which an isotropic etching step using F-based radicals, a passivation film forming step using $CF_4$-based radicals, and an anisotropic etching step using F-based ions are repeated, for example.

The trenchs 20 are preferably formed by overall etching, with the mask being the passivation film on the front surface side of the silicon substrate 10. This method does not involve lithography. Accordingly, the manufacturing process can be simplified, and the costs can be lowered.

Figure 11E:
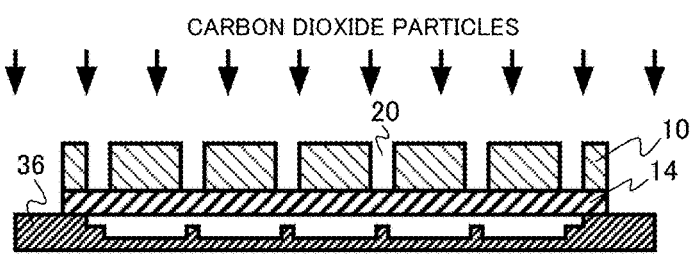
Figure 11F:
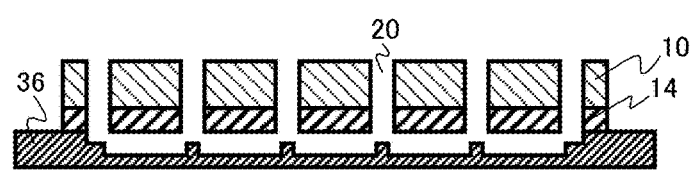

Carbon dioxide particles are then injected from the front surface side of the silicon substrate 10 (FIG. 11E). As the carbon dioxide particles are injected, the portions of the metal film 14 on the back surface side of the trenchs 20 are removed. The metal film 14 is physically removed by carbon dioxide particles (FIG. 11F).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are generated by adiabatically expanding a liquefied carbon dioxide, for example. The generated carbon dioxide particles are ejected together with a nitrogen gas from a nozzle, for example, and are injected onto the metal film 14. The mean particle size of the carbon dioxide particles is preferably not smaller than 10 μm and not greater than 200 μm. The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the metal film 14 when the carbon dioxide particles are injected onto the metal film 14 is preferably not smaller than φ3 mm and not greater than φ10 mm, for example.

Figure 11G:
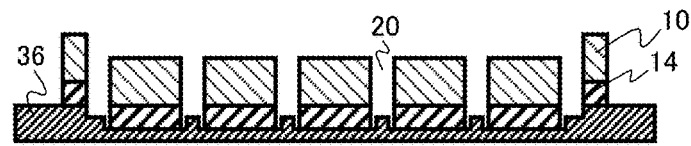

As the metal film 14 on the back surface side of the trenchs 20 is removed, the MOSFETs are divided. The divided MOSFETs fall onto the tray 36 and are secured on the tray 36 (FIG. 11G).

Next, the functions and the effects of the device manufacturing method according to this embodiment are described.

In a case where the metal film 14 is also formed on the back surface side of the silicon substrate 10 as in a vertical MOSFET, the metal film 14 on the back surface side in the dicing region also needs to be removed at the time of dicing. In a case where the semiconductor substrate 10 and the metal film 14 are simultaneously removed from the front surface side by blade dicing, for example, the portions of the metal film 14 along the trenchs 20 in the dicing region curl toward the back surface side, and so-called burrs are formed.

If burrs are formed in the metal film 14, there is a possibility that the semiconductor chips will fail the external appearance test, and will not be turned into products, for example. Also, when the semiconductor chips and metal beds are joined with adhesive agents such as solders, there is a possibility that soldering defects will be formed due to degraded adhesive properties at portions with burrs.

In this embodiment, after the trenchs 20 are formed along the dicing region of the silicon substrate 10, carbon dioxide particles are injected from the front surface side, so that the portions of the metal film 14 located over the trenchs 20 are removed. As the removed portions of the metal film 14 are scraped off into the space on the side of the tray 36, formation of burrs can be restrained. Only the portions of the metal film 14 at the portions corresponding to the trenchs 20 can be removed in a self-aligning manner.

It is considered that the portions of the metal film 14 located over the trenchs 20 are removed by physical impact caused by carbon dioxide particles. In addition to that, it is considered that, as the metal film 14 is rapidly cooled by the low-temperature carbon dioxide particles, and the force generated by gasification and expansion of the carbon dioxide particles that have collided with the metal film 14 is applied, the effect to remove the metal film 14 by physical impact is facilitated.

In a case where the trenchs 20 of the silicon substrate 10 are formed by blade dicing, chipping might occur at the portions of the silicon substrate 10 located around the edges of the trenchs 20 on the back surface side. In this embodiment, on the other hand, the trenchs 20 are formed by plasma etching. Accordingly, chipping at the edges of the trenchs 20 on the back surface side of the silicon substrate 10 can be prevented.

In a case where the trenchs 20 of the silicon substrate 10 are formed by blade dicing, the dicing region needs to have a width equal to or greater than the thickness of the blade. Therefore, a dicing region width of 50 μm or greater is required, for example.

In this embodiment, on the other hand, the trenchs 20 are formed by plasma etching. Accordingly, the width of the dicing region can be reduced. For example, the width of the dicing region can be equal to or greater than 10 μm but smaller than 50 μm, or can even be not greater than 20 μm.

In this embodiment, the metal film or the like is removed by physical impact caused mainly by carbon dioxide particles. Accordingly, even if the metal film is formed with stacked films of different kinds of metals, for example, the metal film can be removed, regardless of the differences in chemical properties among the respective films. This is a different aspect from a case where dry etching is performed. Accordingly, even stacked films of different kinds of metals can be readily removed while shape abnormalities are restrained.

Particularly, in a case where the trench 20 is formed by plasma etching as in this embodiment, the unevenness of the edges of the metal film 14 along the trench 20 is smaller than the unevenness of the side surface of the trench 20 in the silicon substrate 10. In other words, the surface roughness of the edges of the metal film 14 along the trench 20 is smaller than the surface roughness of the side surface of the trench 20.

As described above, this embodiment can provide a device manufacturing method that can reduce shape abnormalities when the metal film is processed.

Fourteenth Embodiment

A device manufacturing method according to this embodiment differs from the device manufacturing method according to the thirteenth embodiment in that, instead of a metal film, a semiconductor device including a resin film is manufactured on the back surface side of the silicon substrate 10. In the following, explanation of the same aspects of those of the thirteenth embodiment will not be repeated.

An example case where the device to be manufactured is a semiconductor memory that includes a resin film on the back surface side and contains silicon (Si) is described below.

FIGS. 12A, 12B, 12C, 12D, 12E, 12F, and 12G are schematic cross-sectional diagrams showing the device manufacturing method according to this embodiment.

First, a pattern formed with the memory transistors, the peripheral circuits, the power electrodes, the ground electrodes, the I/O electrodes, and the like of semiconductor memories (semiconductor devices) is formed on the front surface side of a silicon substrate (a substrate) 10 having a first surface (hereinafter referred to the front surface) and a second surface (hereinafter also referred to as the back surface). A passivation film is then formed on the uppermost layer of the silicon substrate 10. The passivation film is an inorganic insulating film such as a resin film made of polyimide or the like, a silicon nitride film, or a silicon oxide film.

Figure 12A:
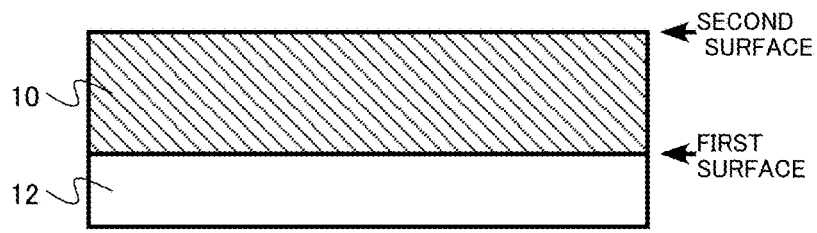
FIGS. 12A, 12B, 12C, 12D, 12E, 12F, and 12G are schematic cross-sectional diagrams showing a device manufacturing method according to a fourteenth embodiment.

A supporting substrate (a support) 12 is then bonded to the front surface side of the silicon substrate 10 (FIG. 12A). The supporting substrate 12 is quartz glass, for example.

Figure 12B:
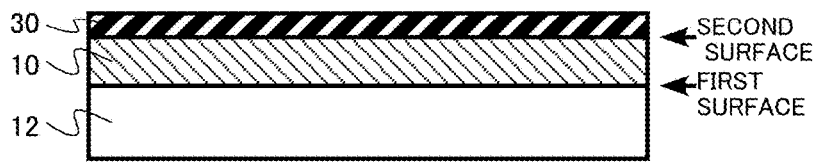

The back surface side of the silicon substrate 10 is ground, so that the silicon substrate 10 becomes thinner. A resin film 30 is then formed on the back surface side of the silicon substrate 10 (FIG. 12B). The resin film 30 is provided substantially on the entire back surface.

The resin film 30 is a DAF (Die Attach Film) for bonding divided semiconductor chips onto the substrate, for example. The thickness of the resin film 30 is not smaller than 10 μm and not greater than 200 μm, for example.

Figure 12C:
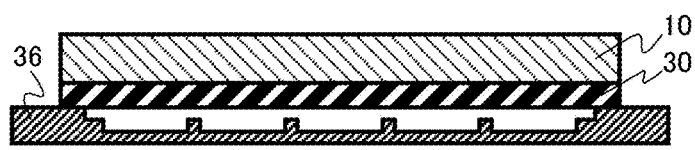

With the back surface side of the silicon substrate 10 facing downward, the metal film 14, the silicon substrate 10, and the supporting substrate 12 are placed on a tray 36. The silicon substrate 10 is supported by the tray 36 only at the peripheral portion. Other than the peripheral portion, a void exists between the silicon substrate 10 and the tray 36. The peripheral portion of the silicon substrate 10 and the resin film 30 may be secured to the peripheral portion of the tray 36 with an adhesive layer. The supporting substrate 12 is then removed from the silicon substrate 10 (FIG. 12C).

Figure 12D:
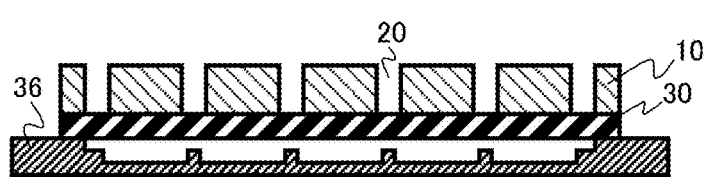

Trenchs 20 are then formed in part of the silicon substrate 10 so that the resin film 30 on the back surface side is exposed through the front surface side along the dicing region formed on the front surface side of the silicon substrate 10 (FIG. 12D). Here, the dicing region is a reserved region having a predetermined width for dividing semiconductor chips by dicing, and is provided on the front surface side of the silicon substrate 10. The patterns of the semiconductor devices are not formed in the dicing region. The dicing region is provided on the front surface side of the silicon substrate 10, and is formed in a grid-like shape, for example.

The trenchs 20 are formed by blade dicing, for example.

Figure 12E:
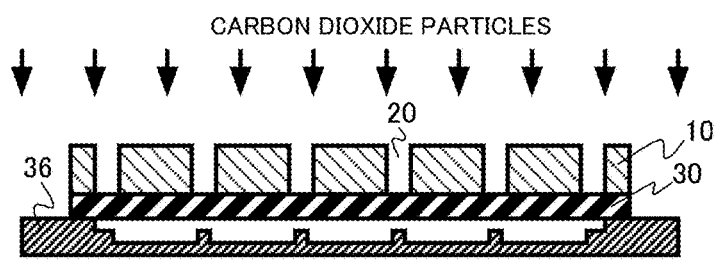
Figure 12F:
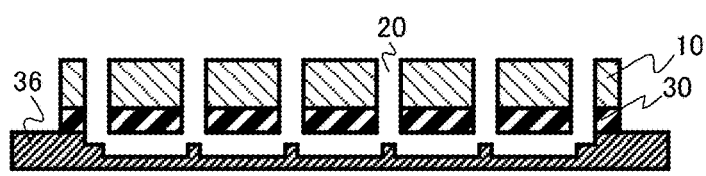

Carbon dioxide particles are then injected from the front surface side of the silicon substrate 10 (FIG. 12E). As the carbon dioxide particles are injected, the portions of the resin film 30 on the back surface side of the trenchs 20 are removed. The resin film 30 is physically removed by carbon dioxide particles (FIG. 12F).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are ejected together with a nitrogen gas from a nozzle, for example, and are injected onto the resin film 30. The mean particle size of the carbon dioxide particles is preferably not smaller than 10 μm and not greater than 200 μm. The mean particle size of the carbon dioxide particles can be determined by taking an image of the carbon dioxide particles ejected from the nozzle with a high-speed camera, and measuring the lengths of the particles shown in the taken image, for example.

The spot diameter on the surface of the resin film 30 when the carbon dioxide particles are injected onto the resin film 30 is preferably not smaller than φ3 mm and not greater than φ10 mm, for example.

Figure 12G:
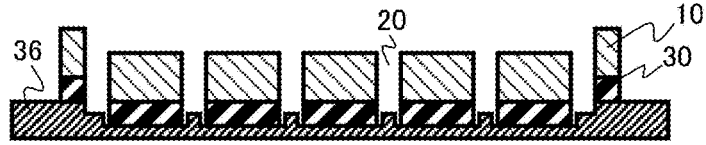

As the resin film 30 on the back surface side of the trenchs 20 is removed, the semiconductor memories are divided. The divided semiconductor memories fall onto the tray 36 and are secured on the tray 36 (FIG. 12G).

Next, the functions and the effects of the device manufacturing method according to this embodiment are described.

In a semiconductor device, like a semiconductor memory to be used in a small-sized electronic apparatus such as a portable telephone, a BGA (Ball Grid Array) or an MCP (Multi Chip Package), which is a small-sized, thin semiconductor package, is used. In a BGA or an MCP, a film-type die bonding material such as DAF is used, instead of a paste-like die bonding material.

In a case where the resin film 30 such as DAF is formed on the back surface side of the silicon substrate 10, the resin film 30 on the back surface side in the dicing region also needs to be removed at the time of dicing. For example, in a case where the semiconductor substrate 10 and the resin film 30 are simultaneously removed from the front surface side by blade dicing, the resin film 30 might come off the edges of the trenchs 20 in the dicing region, or the cut surfaces of the resin film 30 might not have linear surfaces but have irregular shapes.

In this embodiment, after the trenchs 20 are formed along the dicing region of the silicon substrate 10, carbon dioxide particles are injected onto the resin film 30 from the front surface side, so that the portions of the resin film 30 located over the trenchs 20 are removed. As the removed portions of the resin film 30 are scraped off into the space on the side of the tray 36, formation of burrs can be restrained. Also, the cut surfaces of the resin film 30 are linear surfaces.

It is considered that the portions of the resin film 30 located over the trenchs 20 are removed by physical impact caused by carbon dioxide particles. In addition to that, it is considered that, as the resin film 30 is rapidly cooled by the low-temperature carbon dioxide particles, and the force generated by gasification and expansion of the carbon dioxide particles that have collided with the resin film 30 is applied, the effect to remove the resin film 30 by physical impact is facilitated.

As described above, this embodiment can provide a device manufacturing method that can reduce shape abnormalities when the resin film is processed.

Fifteenth Embodiment

A device manufacturing method according to this embodiment is the same as the device manufacturing method according to the thirteenth embodiment, except that pressurized water (water jet) is used, instead of carbon dioxide particles. In the following, explanation of the same aspects of those of the thirteenth embodiment will not be repeated.

In this embodiment, pressurized water is injected onto the metal film 14 from the front surface side of the silicon substrate 10. As the pressurized water is injected, the portions of the metal film 14 on the back surface side of the trenchs 20 are removed. The metal film 14 is physically removed by the pressurized water. This process is so-called water jet machining.

As described above, this embodiment can also provide a device manufacturing method that can reduce shape abnormalities when the metal film is processed.

Sixteenth Embodiment

A device manufacturing method according to this embodiment is the same as the device manufacturing method according to the thirteenth embodiment, except that pressurized water containing abrasive grains is used, instead of carbon dioxide particles. In the following, explanation of the same aspects of those of the thirteenth embodiment will not be repeated.

In this embodiment, pressurized water containing abrasive grains is injected onto the metal film 14 from the front surface side of the silicon substrate 10. As the pressurized water containing abrasive grains is injected, the portions of the metal film 14 on the back surface side of the trenches 20 are removed. The metal film 14 is physically removed by the pressurized water containing abrasive grains. This process is so-called abrasive jet machining.

The abrasive grains are alumina particles, silicon carbide particles, or silica particles, for example.

As described above, this embodiment can also provide a device manufacturing method that can reduce shape abnormalities when the metal film is processed.

Although an example case where the trenches are formed by plasma etching has been described in the thirteenth embodiment, the trenches can also be formed by blade dicing or laser dicing. Although an example case where the trenches are formed by blade dicing has been described in the fourteenth embodiment, the trenches can also be formed by plasma etching or laser dicing.

Although an example case where the trenches are formed so that the metal film or the resin film is exposed has been described in each of the thirteenth through sixteenth embodiments, the trenches can be formed so as to leave part of the substrate. In this case, when a substance is injected, the remaining portions of the substrate and the metal film or the resin film at the portions corresponding to the trench portions are removed at the same time.

EXAMPLES

In the following, examples are described.

Example 1

Dicing was performed on a silicon substrate that had semiconductor devices formed on its front surface, and had a metal film formed on its back surface. The same method as the first embodiment was used. First, etching was performed by plasma etching (Bosch process) from the front surface side of the silicon substrate until the metal film was exposed. As a result, trenches were formed. After that, carbon dioxide particles were injected onto the surface of the metal film from the back surface side, and the metal film on the back surface side of the trenches was removed.

The mean particle size of the carbon dioxide particles was not smaller than 10 μm and not greater than 200 μm. The spot diameter on the surface of the metal film at the time of injecting of the carbon dioxide particles onto the metal film was φ3 mm.

Figure 15:
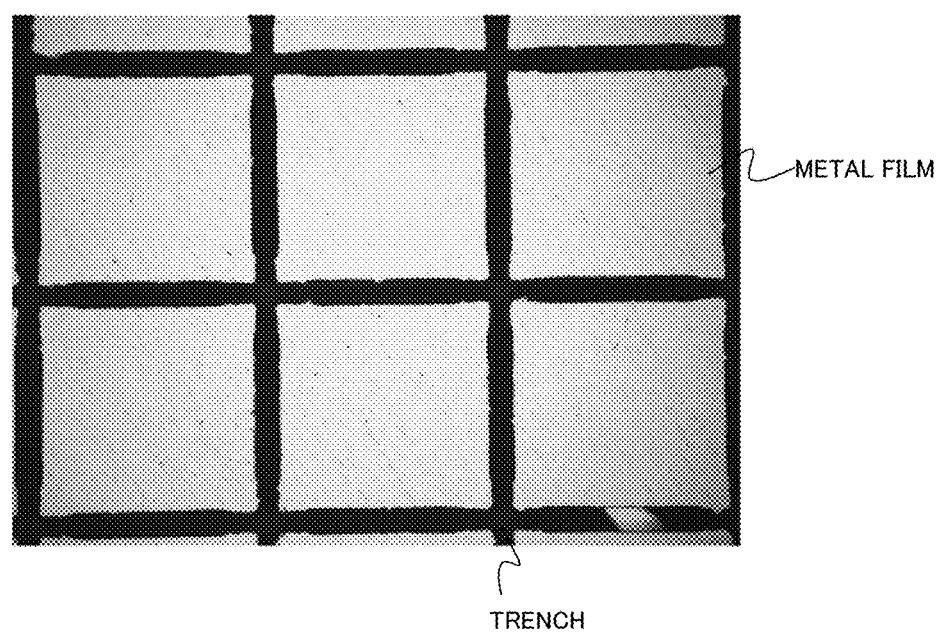
FIG. 15 is an optical photomicrograph taken after dicing in Example 1.

FIGS. 13A, 13B, 13C, 14A, and 14B are SEM photomicrographs taken after dicing in this example, and FIG. 15 is an optical photomicrograph taken after the dicing in this example. The optical photomicrograph in FIG. 15 was taken from the metal film side.

Figure 13A:
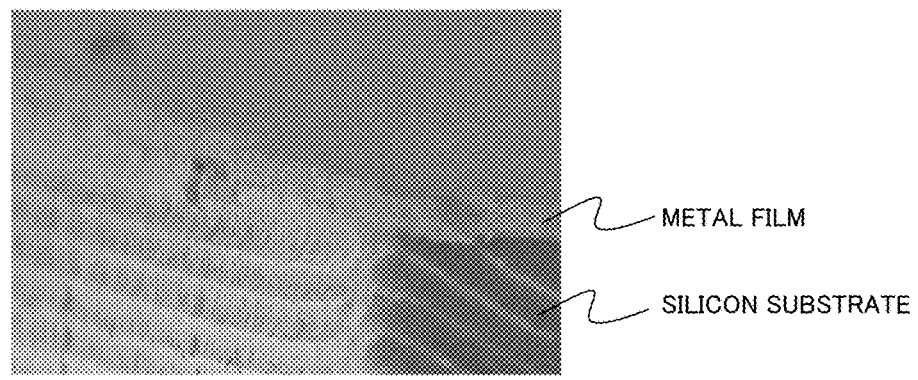
FIGS. 13A, 13B, and 13C are SEM photomicrographs taken after dicing in Example 1.
Figure 13B:
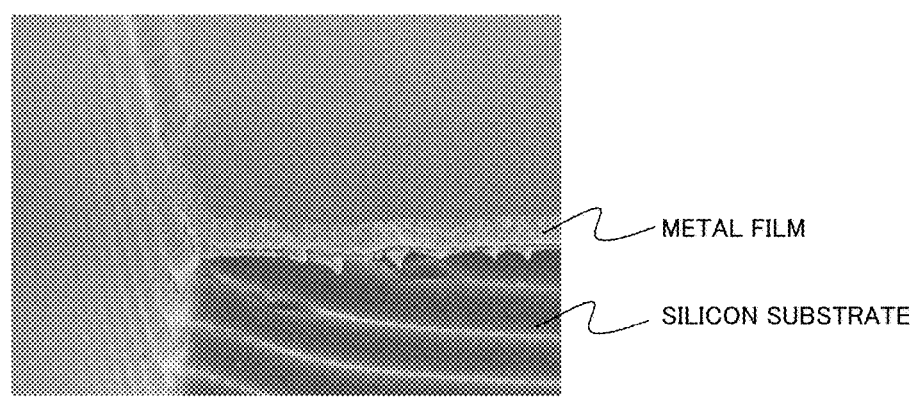
Figure 13C:
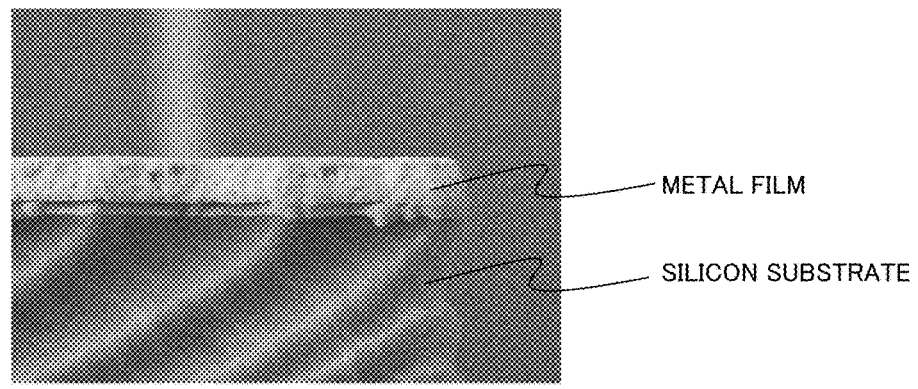
Figure 14A:
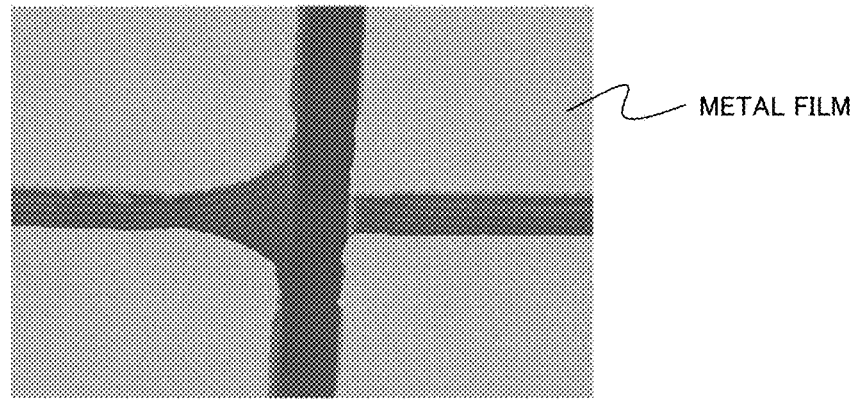
FIGS. 14A and 14B are SEM photomicrographs taken after dicing in Example 1.
Figure 14B:
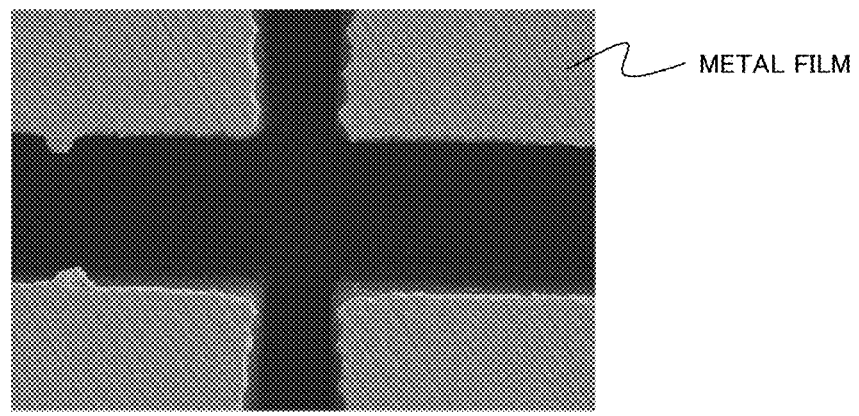

As is apparent particularly from FIGS. 13A, 13B, and 13C, shape abnormalities (burrs), such as peeling of the metal film at the edges of the trenches, are not observed. As is apparent particularly from FIG. 13C, the edges of the metal film are located further away from the trenchs, compared with the edges of the silicon at the boundary between the silicon substrate and the metal film. The edges of the metal film are sloped in the direction away from the trenches, or in the direction toward the surface of the metal film from the boundary between the silicon substrate and the metal film. The slopes become gentler toward the surface of the metal film.

As is apparent particularly from FIG. 15, the unevenness of the edges of the metal film is small, and the edges of the metal film are linearly processed. The protrusions of the metal film into the trenches are controlled to be less than half the width of the trenches. As is apparent particularly from FIGS. 14A, 14B, and 15, any concavities, scratches, and the like caused by impact of the carbon dioxide particles are not observed on the surface of the metal film.

As is apparent particularly from FIGS. 13A, 13B, and 13C, wavelike unevenness caused by the Bosch process is observed on the side surfaces of the trenches in the silicon substrate. Accordingly, the unevenness of the edges of the metal film along the trenches is smaller than the unevenness of the side surfaces of the trenches.

Example 2

Dicing was performed on a silicon substrate that had semiconductor devices formed on its front surface, and had a metal film formed on its back surface. First, etching was performed by plasma etching (Bosch process) from the front surface side of the silicon substrate until the metal film was exposed. As a result, trenches were formed. After that, pressurized water was injected onto the surface of the metal film from the back surface side, and the metal film on the back surface side of the trenches was removed.

Figure 16A:
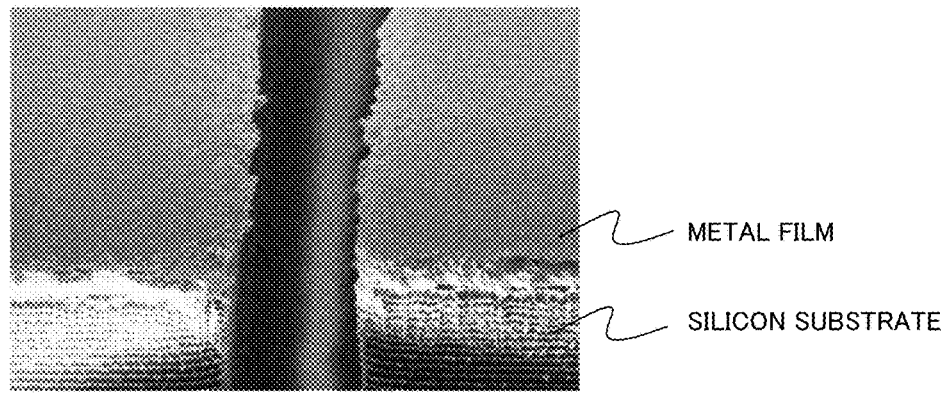
FIGS. 16A, 16B, and 16C are SEM photomicrographs taken after dicing in Example 2.
Figure 16B:
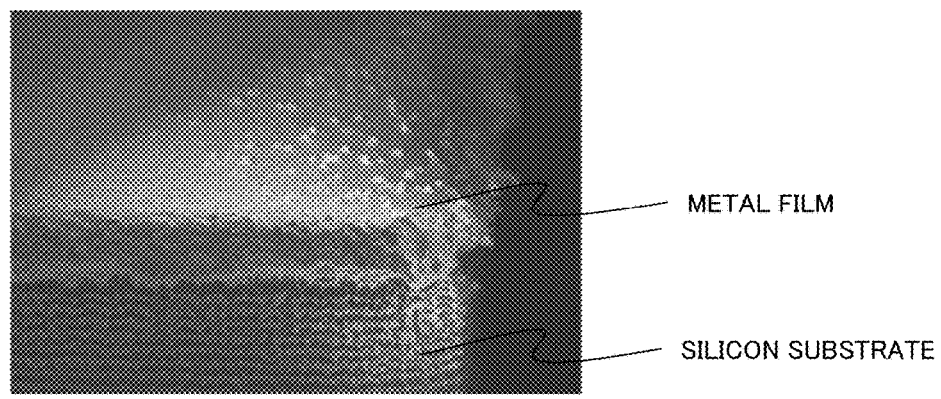
Figure 16C:
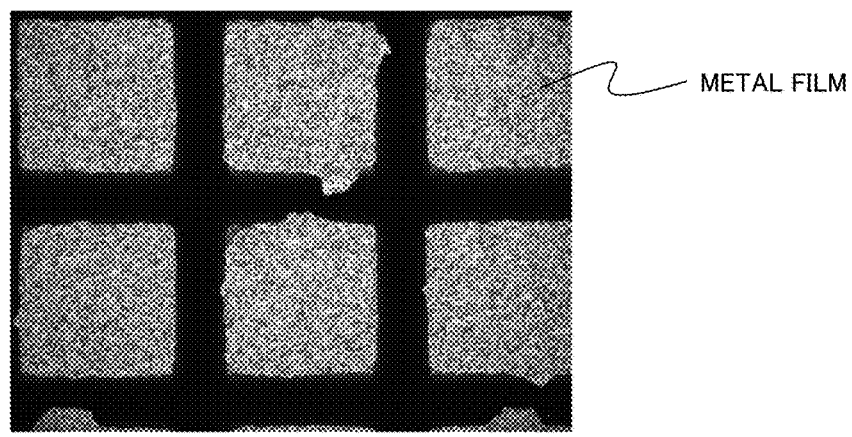

FIGS. 16A, 16B, and 16C are SEM photomicrographs taken after dicing in Example 2. The SEM photomicrograph in FIG. 16C was taken from the metal film side.

The metal film at the trench portions was removed as in Example 1, and shape abnormalities (burrs), such as peeling of the metal film at the edges of the trenches, are not observed. As is apparent from FIG. 16B, the edges of the metal film are located closer to the trenchs than the edges of the silicon at the boundary between the silicon substrate and the metal film. Also, the surface of the metal film protrudes into the trenchs.

As is apparent particularly from FIG. 16C, the unevenness of the edges of the metal film is large, and some of the protrusions of the metal film into the trenchs are equivalent to a half or more of the width of the trenches.

Example 3

Dicing was performed on a silicon substrate that had semiconductor devices formed on its front surface, and had a metal film formed on its back surface. First, etching was performed by plasma etching (Bosch process) from the front surface side of the silicon substrate until the metal film was exposed. As a result, trenches were formed. After that, pressurized water containing abrasive grains was injected onto the surface of the metal film from the back surface side, and the metal film on the back surface side of the trenchs was removed. The metal film was removed by so-called abrasive jet machining.

Figure 17:
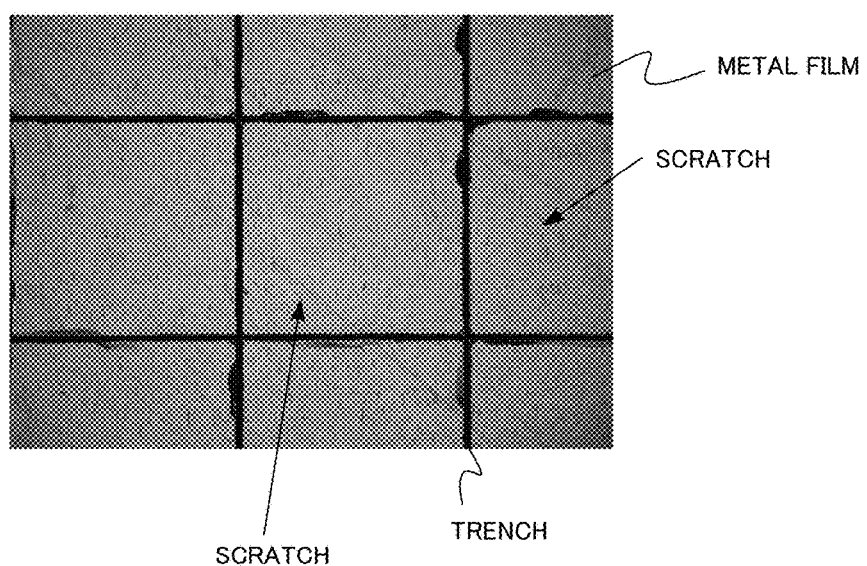
FIG. 17 is an optical photomicrograph taken after dicing in Example 3.

FIG. 17 is an optical photomicrograph taken after dicing in Example 3. The optical photomicrograph in FIG. 17 was taken from the metal film side.

The metal film at the trench portions was removed as in Example 1, and shape abnormalities (burrs), such as peeling of the metal film at the edges of the trenchs, are not observed. Scratches caused by the abrasive grains were observed on the surface of the metal film.

Comparative Example 1

Dicing was performed on a silicon substrate that had semiconductor devices formed on its front surface, and had a metal film formed on its back surface. The silicon substrate and the metal film were simultaneously removed from the front surface side by blade dicing.

Figure 18A:
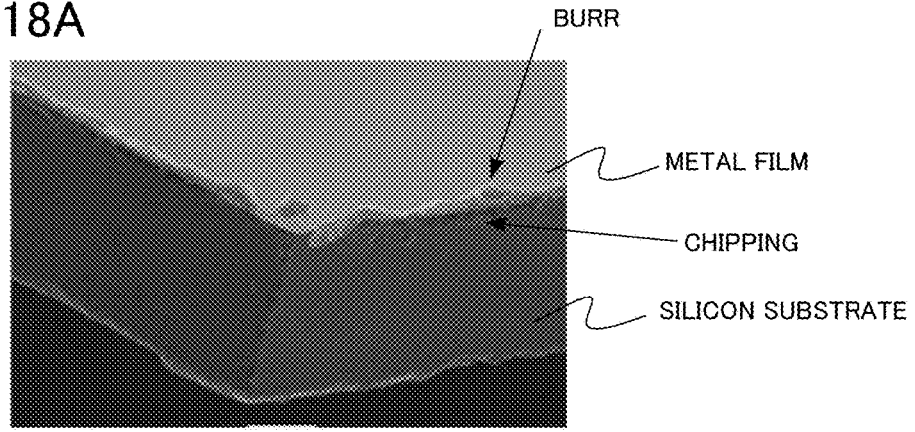
FIGS. 18A, 18B, and 18C are SEM photomicrographs taken after dicing in Comparative Example 1.
Figure 18B:
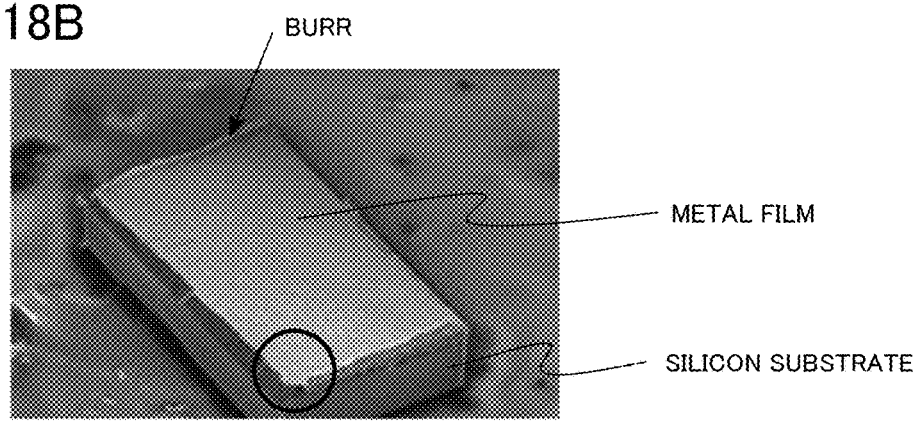
Figure 18C:
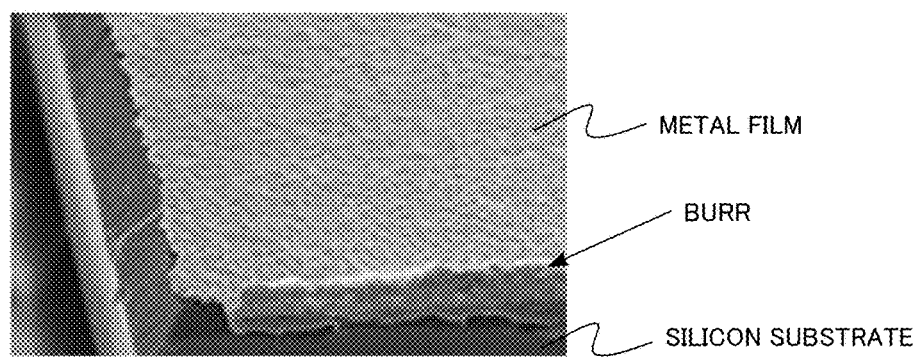

FIGS. 18A, 18B, and 18C are SEM photomicrographs taken after dicing in Comparative Example 1. FIG. 18C is an enlarged view of the portion surrounded by a circle in FIG. 18B.

As is apparent from FIGS. 18A, 18B, and 18C, shape abnormalities (burrs), such as peeling of the metal film at the edges of the trenchs, were observed. As shown in FIG. 18A, chipping of silicon was also observed in the vicinity of the boundary between the silicon substrate and the metal film.

Comparative Example 2

Dicing was performed on a silicon substrate that had semiconductor devices formed on its front surface, and had a metal film formed on its back surface. The silicon substrate and the metal film were simultaneously removed from the front surface side by laser dicing.

Figure 19A:
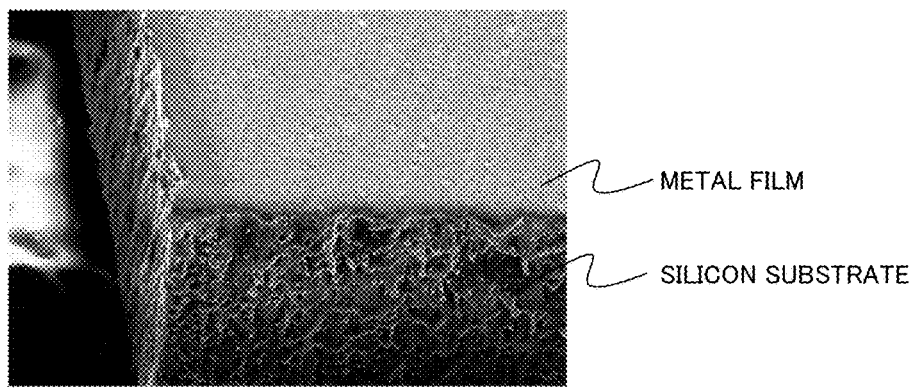
FIGS. 19A, 19B, and 19C are SEM photomicrographs taken after dicing in Comparative Example 2.
Figure 19B:
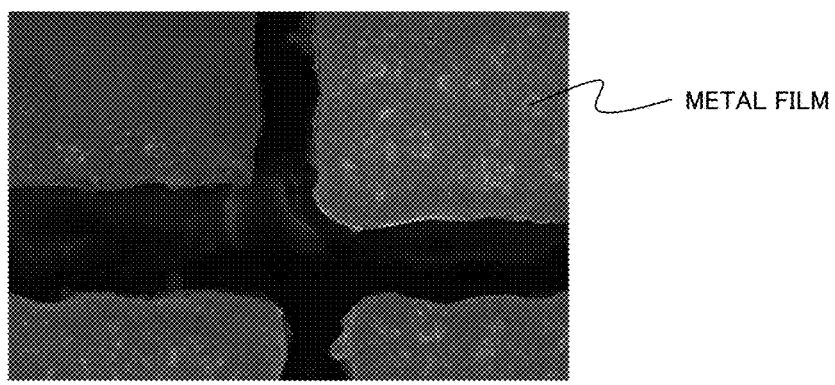
Figure 19C:
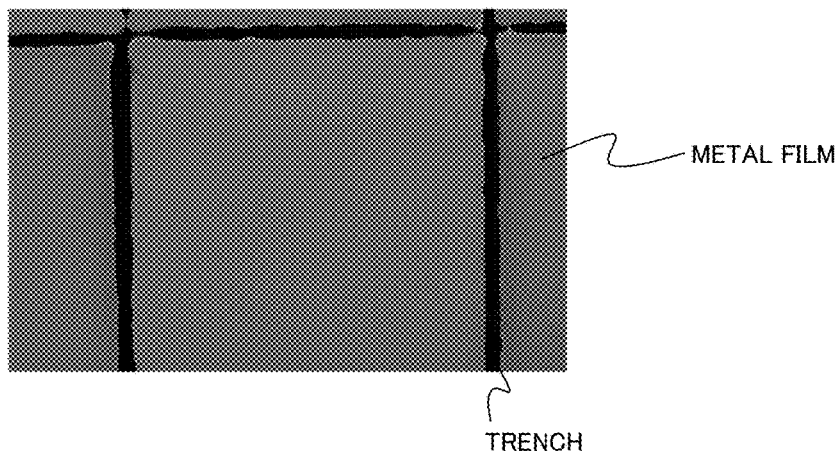

FIGS. 19A, 19B, and 19C are SEM photomicrographs taken after dicing in Comparative Example 2. The SEM photomicrograph in FIG. 19C was taken from the metal film side.

Structures indicating that the surfaces melted with laser energy were observed at the side surfaces of the trenchs in the silicon substrate and the edges of the metal film.

Comparisons between Examples 1 through 3 and Comparative Examples 1 and 2 confirmed that shape abnormalities such as burrs were restrained in Examples. It was confirmed that cuts, scratches, and the like on the surface of the metal film were restrained particularly in Example 1. Also, it was confirmed that the unevenness of the edges of the metal film was small, and the edges of the metal film were linearly processed particularly in Example 1.

In the first through sixteenth embodiments, the semiconductor devices are vertical MOSFETs or semiconductor memories. However, the semiconductor device are not limited to vertical MOSFETs and semiconductor memories.

In the first through sixteenth embodiments, the present disclosure is applied to manufacturing of MOSFETs or semiconductor memories. However, the present disclosure can also be applied to manufacturing of IGBTs (Insulated Gate Bipolar Transistors), small-signal devices, or MEMSs (Micro Electro Mechanical Systems).

In the first through sixteenth embodiments, the substrate is a semiconductor substrate. However, the present disclosure can also be applied to substrates other than semiconductor substrates, such as a ceramic substrate, a glass substrate, and a sapphire substrate.

In the first through sixteen embodiments, carbon dioxide particles are injected onto a metal film or a resin film as an example. However, it is also possible to use other particles that are solid at the time of injecting from a nozzle but gasify in an atmosphere in which a substrate is placed at ordinary temperature or the like. For example, it is possible to use nitrogen particles or argon particles.

In the first through sixteenth embodiments, a metal film or a resin film is used as the film formed on the second surface side. However, it is also possible to use an inorganic insulating film such as a nitride film or an oxide film, or the like.

While certain embodiments have been described, these embodiments have been presented by way of example only, and are not intended to limit the scope of the inventions. Indeed, the device manufacturing method, and the device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A device manufacturing method comprising:
    forming a film on a substrate having a first surface and a second surface, the film being formed on the second surface side of the substrate, the substrate having a device region on the first surface side;
    forming a trench in part of the substrate from the first surface side of the substrate, while leaving the film to remain; and
    removing the film at a portion on the second surface side of the trench by injecting a substance onto the film from the second surface side of the substrate, a part of the film being remained on the substrate after the removing.

2. The method according to claim 1, wherein the film is one of a metal film and a resin film.

3. The method according to claim 1, wherein the substance is particles containing carbon dioxide.

4. The method according to claim 1, wherein, when the trench is formed, the film is exposed.

5. The method according to claim 1, wherein the substrate is a semiconductor substrate.

6. The method according to claim 1, wherein, when the film is removed, an angle of inclination of an edge of the film along the trench to the second surface is smaller than an angle of inclination of a side surface of the trench to the second surface.

7. The method according to claim 1, wherein the trench is formed by plasma etching.

8. The method according to claim 1, wherein the trench is formed by blade dicing.

9. The method according to claim 1, wherein, before the film is formed, the second surface side of the substrate is removed to make the substrate thinner.

10. The method according to claim 1, wherein, after the trench is formed, a resin sheet is bonded to the first surface side before the film is removed, and the substance is injected when the film is removed, with the resin sheet being covered with a mask.

11. A device manufacturing method comprising:
    forming a trench in part of a substrate having a first surface and a second surface, the trench being formed from the first surface side of the substrate;

removing the second surface side of the substrate while leaving the substrate to remain at a portion of the second surface side of the trench;

forming a film on the second surface side; and injecting a substance onto the film from the second surface side, to remove the film at a portion on the second surface side of the trench and the substrate at the portion on the second surface side of the trench, and to expose the trench.

12. The method according to claim 11, wherein the film is one of a metal film and a resin film.

13. The method according to claim 11, wherein the substance is particles containing carbon dioxide.

14. A device manufacturing method comprising:

forming a film on a substrate having a first surface and a second surface, the film being formed on the second surface side of the substrate, the substrate having a device region on the first surface side;

forming a trench in part of the substrate from the first surface side, while leaving the film to remain; and injecting a substance from the first surface side, to remove the film at a portion on the second surface side of the trench, a part of the film being remained on the substrate after the injecting.

15. The method according to claim 14, wherein the film is one of a metal film and a resin film.

16. The method according to claim 14, wherein the substance is particles containing carbon dioxide.

17. The method according to claim 14, wherein, when the trench is formed, the film is exposed.

* * * * *